United States Patent
Calamante et al.

(10) Patent No.: US 9,720,062 B2
(45) Date of Patent: Aug. 1, 2017

(54) IMAGE PROCESSING SYSTEM

(75) Inventors: Fernando Calamante, Heidelberg West VIC (AU); Jacques-Donald Tournier, Heidelberg West VIC (AU); Alan Connelly, Heidelberg West VIC (AU); Graeme Jackson, Heidelberg West VIC (AU)

(73) Assignee: Brain Research Institute Foundation Pty Ltd., Heidelberg (AU)

( * ) Notice: Subject to any disclaimer, the term of this patent is extended or adjusted under 35 U.S.C. 154(b) by 172 days.

(21) Appl. No.: 13/582,069

(22) PCT Filed: Mar. 3, 2010

(86) PCT No.: PCT/AU2010/000257
§ 371 (c)(1),
(2), (4) Date: Sep. 12, 2012

(87) PCT Pub. No.: WO2011/106821
PCT Pub. Date: Sep. 9, 2011

(65) Prior Publication Data
US 2013/0009959 A1 Jan. 10, 2013

(51) Int. Cl.
*G01R 33/563* (2006.01)
*G06T 7/00* (2017.01)
*G06T 17/00* (2006.01)

(52) U.S. Cl.
CPC ...... *G01R 33/56341* (2013.01); *G06T 7/0012* (2013.01); *G06T 17/00* (2013.01);
(Continued)

(58) Field of Classification Search
None
See application file for complete search history.

(56) References Cited

U.S. PATENT DOCUMENTS 5,410,250 A * 4/1995 Brown .................... 324/309
6,806,705 B2 10/2004 van Muiswinkel et al.
(Continued)

OTHER PUBLICATIONS

P. Mukherjee, J.I. Berman, S.W. Chung, C.P. Hess, R.G. Henry, "Diffusion Tensor MR Imaging and Fiber Tractography: Theoretic Underpinnings", 2008, The Department of Radiology, University of California, San Francisco.*
(Continued)

*Primary Examiner* — Mark Zimmerman
*Assistant Examiner* — Yu-Jang Tswei
(74) *Attorney, Agent, or Firm* — Crowell & Moring LLP

(57) ABSTRACT

A process for generating enhanced resolution images of fibrous tissue within a portion of a body being sampled, including accessing source data representing a distribution of the tissue orientations for a plurality of discrete sample imaging elements defined within the portion based on a first imaging resolution; generating, based on the source data, streamline data representing a plurality of fiber tracks, each representing an estimated path of fibers in the tissue within the portion; generating an output matrix for a plurality of discrete output imaging elements within the portion based on a second imaging resolution that provides higher imaging resolution than the first imaging resolution; generating, for each output imaging element, image data including intensity data based on a number of fiber tracks at a location corresponding to the output imaging element; and generating display data for a device to display an enhanced image generated based on the image data.

13 Claims, 14 Drawing Sheets

(52) U.S. Cl.
CPC ............... *G06T 2207/10088* (2013.01); *G06T 2207/30016* (2013.01)

(56) References Cited

U.S. PATENT DOCUMENTS

| | | | |
|---|---|---|---|
| 6,859,203 B2* | 2/2005 | van Muiswinkel et al. | 345/424 |
| 6,998,841 B1 | 2/2006 | Tamez-Peña et al. | |
| 7,355,597 B2 | 4/2008 | Laidlaw et al. | |
| 7,417,428 B2 | 8/2008 | Hoogenraad et al. | |
| 7,657,071 B2 | 2/2010 | Bartesaghi et al. | |
| 2005/0101857 A1* | 5/2005 | Masutani et al. | 600/410 |
| 2006/0229856 A1 | 10/2006 | Burrus et al. | |
| 2007/0217664 A1 | 9/2007 | Flipo et al. | |
| 2010/0004527 A1* | 1/2010 | Dale et al. | 600/410 |

OTHER PUBLICATIONS

Australian Examination Report dated Mar. 17, 2014 (Six (6) pages).
Zhang et al., "Probabilistic White Matter Fiber Tracking Using particle Filtering and von Mises-Fisher Sampling", Medical Image Analysis, 2009, vol. 13, No. 1, pp. 5-18.
Behrens TEJ et al.: "Characterization and propagation of uncertainty in diffusion-weighted MR imaging", Magnetic Resonance in Medicine, 2003; 50, pp. 1077-1088 (twelve (12) sheets).
Mackay DJC: "Monte Carlo Methods: Rejection Sampling" Information Theory, Inference, and Learning Algorithms, 6th ed. Cambridge, UK: Cambridge University Press, 2003, pp. 364-365 (two (2) sheets).
Mori S and van Zijl PC: "Fiber tracking: principles and strategies—a technical review", NMR in Biomedicine 2002; 15, 468-480 (fourteen (14) sheets).
Tournier, J-D., Calamante, F., Connelly, A.: "Robust determination of the fibre orientation distribution in diffusion MRI: non-negativity constrained super-resolved spherical deconvolution", NeuroImage 2007; 35, pp. 1459-1472 (fourteen (14) sheets).
Mori S et al.: "Three-dimensional tracking of axonal projections in the brain by magnetic resonance imaging", Annals of Neurology, 1999; 45, pp. 265-269 (five (5) sheets).
Pajevic S and Pierpaoli C: "Color schemes to represent the orientation of anisotropic tissues from diffusion tensor data: application to white matter fiber tract mapping in the human brain", Magnetic Resonance in Medicine, 1999; 42, pp. 526-540 (fifteen (15) sheets).
Jones DK and Pierpaoli C: "Confidence mapping in diffusion tensor magnetic resonance imaging tractography using a bootstrap approach", Magnetic Resonance in Medicine 2005; 53, pp. 1143-1149 (seven (7) sheets).
Basser PJ et al.: "In Vivo Fiber Tractography Using DT-MRI Data", Magnetic Resonance in Medicine 2000; 44, pp. 625-632 (eight (8) sheets).
Basser PJ, Mattiello J, et al.: "MR diffusion tensor spectroscopy and imaging", Biophysics Journal, 1994; 66, pp. 259-267 (ten (10) sheets).
Behrens TEJ, et al.: "Non-invasive mapping of connections between human thalamus and cortex using diffusion imaging", Nature Neuroscience, 2003; 6: pp. 750-757 (ten (10) sheets).
Berman J et al.: "Probabilistic streamline q-ball tractography using the residual bootstrap", NeuroImage, 2008; 39, pp. 215-222 (eight (8) sheets).
Correia S et al.: "Quantitative tractography metrics of white matter integrity in diffusion-tensor MRI", NeuroImage, 2008; 42, pp. 568-581 (fourteen (14) sheets).
Becher B et al., "Interferon-$\gamma$ secretion by peripheral blood T-cell subsets in multiple sclerosis: Correlation with disease phase and interferon-$\beta$ therapy", American Neurological Association, 1999; 45, pp. 247-250 (twenty-three (23) sheets).
Conturo TE, et al.: "Tracking neuronal fibre pathways in the living human brain", Proc. Natl. Acad. Sci. USA, 1999; 96, pp. 10422-10427 (six (6) sheets).
Mishra A et al.: "Unified framework for anisotropic interpolation and smoothing of diffusion tensor images", NeuroImage, 2006; 31, pp. 1525-1535 (eleven (11) sheets).
Pajevic S et al.: "A Continuous Tensor Field Approximation of Discrete DT-MRI Data for Extracting Microstructural and Architectural Features of Tissue", Journal of Magnetic Resonance, 2002; 154, pp. 85-100 (sixteen (16) sheets).
International Search Report dated May 12, 2010 (three (3) pages).
Written Opinion of the International Searching Authority (Form PCT/ISA/237) (five (5) pages).

* cited by examiner

IMAGE PROCESSING SYSTEM

FIELD

The present invention relates to diagnostic imaging systems, and in particular, but not being limited to, magnetic resonance imaging systems.

BACKGROUND

Nuclear magnetic resonance (NMR) is a phenomenon whereby the nuclei of certain elements that have a non-zero magnetic moment (for example $^1H$, $^{31}P$, $^{13}C$) can interact with a static applied magnetic field to adopt a series of discrete allowed orientations with respect to the direction of the applied field. A radiofrequency magnetic field can then be applied in such a way as to perturb the equilibrium state of the nuclei such that an NMR signal can be detected either in the same coil as used to transmit the radiofrequency magnetic field or in a different radiofrequency receiver coil. The addition of a third type of magnetic field, namely magnetic field gradients, can be used to make the NMR signals spatially dependent. The application of magnetic field gradients in each of the three mutually orthogonal spatial axes (x, y, and z) enables the signals to be encoded in such a way that the detected signals can be processed to produce an image of the object giving rise to the signals. This method is known as magnetic resonance imaging (MRI). The MRI method can be used to produce images of living tissue (usually based on the hydrogen nucleus) in whole animals and humans, and has become a powerful imaging tool both in research and in clinical medicine.

An image generated using MRI is made up of a plurality of small volume imaging elements (also referred to as 'voxels'), which are defined by an imaging matrix. The imaging matrix may be either a two or three dimensional grid defined relative to the region of an object being sampled. The region of the object being sampled may be referred to as a "field-of-view", or "sampled region" when image sampling (or imaging) of the region has completed. The size of the voxels determines the spatial resolution of the image, with smaller voxels being able to provide finer image detail (i.e. produce images with higher image resolution) and larger voxels being able to provide less image detail (i.e. produce images with lower image resolution). A standard imaging resolution refers to the spatial resolution of the source image data obtained using a voxel size (defined by an imaging matrix) that is typically used for imaging an object based on a particular imaging technique (such as MRI). For example, in the context of diffusion-weighted MRI, imaging is typically performed based on a voxel size of approximately 2 mm×2 mm×2 mm or larger. The standard imaging resolution applicable as a reference for the system and method described herein may be different in size depending on type or context of the imaging being performed.

The quality of the image will be also influenced by a level of experimental (or background) image noise present. Such noise is commonly measured by a signal-to-noise ratio (SNR). The SNR level in an MRI image is dependent on the size of the voxel. The smaller the voxel size, the smaller the signal, while the noise level is unchanged. Thus, a smaller voxel gives rise to a lower SNR. MRI suffers from an intrinsic limitation in that spatial resolution, SNR, and the time required to acquire images are all strongly interdependent factors. This interdependency makes it difficult to improve any one of these aspects without compromising the others.

A problem with MRI is the trade off between imaging time and the resulting image resolution. MRI imaging on a region using smaller voxels takes significantly more time than MRI imaging on the same region using larger voxels. Various methods have been proposed to produce higher-resolution images of a sampled region using MRI, such as:

Reducing the "field-of-view" of the image, which involves obtaining source image data of a smaller area of an object using the same number of voxels (defined by an imaging matrix within the reduced "field-of-view") as that typically used for imaging a standard (larger) "field-of-view", where each voxel has a smaller voxel size;

Increasing the number of acquired voxels, which involves obtaining source image data of a target "field-of-view" using a larger number of acquired voxels (defined by an imaging matrix within the target "field of view") than that typically used for imaging any "field-of-view", where each voxel has a smaller voxel size;

Increasing the reconstructed number of voxels by combining source image data acquired from multiple receiver coils (also referred to as "parallel-imaging" MRI); and Using super-resolution techniques, which involve combining multiple magnetic resonance (MR) images (sampled at a standard imaging resolution) taken with subvoxel-shifts in a slice-direction in order to reconstruct an image with higher-resolution in the slice-direction.

There are problems with the above approaches. Imaging over a smaller area of an object (with the same imaging matrix size) can provide greater visual detail of that area but at a cost of having less overall visual information. This technique may not be a practical option where the region required for imaging is a larger area than the reduced area being sampled. Where the reduced sample area only covers a subset of the target region required to be sampled, the imaging process needs to be repeat across the entire target region (to maintain the high level of imaging detail), which significantly increases imaging time. MRI images produced based on a small voxel size are more sensitive to errors caused by (e.g. inadvertent) movement of the object during sampling. Such errors are correctable by rescanning the object, but this can take considerable time. "Parallel-imaging" MRI techniques require the use of additional receiver equipment, which increases the technical complexity (and potential for error) in the MRI procedure. The technique of combining information from multiple MR images (taken with subvoxel-shifts in a slice-direction) to produce a higher-resolution image effectively requires additional sampling at subvoxel intervals, which significantly increases the time of performing the MRI procedure.

Super-resolution refers to techniques that in some way enhance the resolution of an imaging system. These techniques typically involve the use of extra information to achieve such a gain in resolution (for example using information from multiple low-resolution images, each with different information content, to generate an image with higher-resolution than any of the source images). However, a problem with super-resolution is the difficulty in identifying the relevant types of information that may be useful for enhancing imaging quality, and also how that information may be efficiently obtained or derived, and used for image enhancement.

Another problem is that MRI images may not effectively illustrate structurally important features (e.g. tissue structure) in the part of the object being sampled. Several techniques have been developed to extract such information. For example, diffusion-weighted imaging (DWI) is a MRI technique that is unique in its ability to probe tissue micro-architecture at the cellular level in vivo in a completely non-invasive manner, by making the MRI images sensitised to the random motion of water molecules. Molecular diffusion refers to the random, microscopic, translational motion of molecules, also known as 'Brownian motion'. In DWI, magnetic field gradients in a given direction are incorporated, and the resulting DWI images are sensitive to the random, diffusion-induced microscopic displacement of water molecules along the chosen gradient direction. In the case of a free liquid without barriers that hinder diffusion, water molecules will diffuse isotropically (that is, they will diffuse without any preferred direction), and the image intensity of the DWI will be independent on the selected magnetic field gradient direction. On the other hand, in coherently-arranged structures such as in brain white matter, the coherent arrangement of axonal fibres gives rises to the preferential displacement of water molecules along the fibres rather than across them. The image intensity of the DWI image is therefore dependent on the orientation of the fibres at that location relative to the direction along which diffusion sensitisation was applied during the MRI measurement. A number of variants of this DWI method are known, depending on the way the diffusion-sensitisation is applied, the way the images are acquired, the model used to analyse the data, etc.

Information processing in the brain takes place in the grey matter, while white matter connects different grey matter regions, as well as the brain to the rest of the body. At the microscopic level, white matter consists primarily of axonal fibres. These fibres are organized into larger bundles known as 'tracts' or 'fasciculi', which provide the coherent arrangement of structures that hinders the diffusion of water molecules, and thus influences the image intensity in DWI.

Since the image intensity of the DWI image is dependent on the orientation of the fibres at a given location relative to the direction along which diffusion sensitisation was applied during the MRI measurement, DWI data have been used to infer the main direction of the fibres in the brain. By acquiring multiple DWI images, each sensitised to diffusion along a different direction, enough information can be gathered to infer the orientation of the white matter fibres within each imaging voxel. The diffusion tensor model was the original method used to extract the fibre orientation from DWI data, giving rise to the more general term 'diffusion tensor imaging' (DTI), as described in Basser P J, Mattiello J, et al.: "*MR diffusion tensor spectroscopy and imaging*", Biophysics Journal 1994; 66, 259-267. With this approach, the signal is modelled assuming a three-dimensional Gaussian diffusion process, and the fibre orientation is assumed to correspond to the direction of fastest diffusion (i.e. the major eigenvector of the diffusion tensor). In this way, a model of the fibre orientation in each voxel can be estimated.

Several properties of the diffusion tensor have been exploited to generate images with various contrasts. Among the most commonly used are the trace of the tensor (a measure of the average diffusivity of the water molecules, averaged uniformly over all directions), and the anisotropy indices (each a measure of the degree of directional-dependence of the diffusion of water molecules).

Image analysis methods that display the directionality of diffusion of water molecules have also been developed, by combining the information of an anisotropy index (typically fractional-anisotropy, or FA) with the directional information contained in the major eigenvector of the diffusion tensor at each voxel location. By assigning a colour (red, green, and blue) for each direction, a directionally-encoded colour (DEC) map is generated, as described in Pajevic S and Pierpaoli C: "*Color schemes to represent the orientation of anisotropic tissues from diffusion tensor data: application to white matter fiber tract mapping in the human brain*", Magnetic Resonance in Medicine 1999; 42, 526-540. In these maps, the right-left component of the major eigenvector is set to the red colour, the anterior-posterior component to green, and the superior-inferior component to blue. Given the lack of coherent structures in gray matter, the intensity of the DEC maps are usually weighted by the corresponding intensity of an anisotropy index, to avoid the presence of random colour distributions in gray matter regions. In this way, the DEC maps can be used to visualise white matter architecture over the whole brain. For example, regions of white mater where the fibres run primarily from left to right will appear red, and so on.

Once the orientation of the white matter fibres is known within each imaging voxel, it becomes possible to estimate the path of the white matter connections, by linking this information across several voxels. To date, a number of fibre-tracking algorithms have been proposed to 'track' the fibre orientations from one brain region to another. Most fibre-tracking algorithms proposed to date are based on the 'streamlines' method, as described in Mori S and van Zijl P C: "*Fiber tracking: principles and strategies—a technical review*", NMR in Biomedicine 2002; 15, 468-480. This technique involves 'tracking' or following the white matter orientation from a user-specified 'seed' point, until the 'track' reaches a 'target' region, or leaves the white matter, or some other termination criterion is reached. The resultant path through three-dimensional space constitutes what is referred to as a "streamline". This approach is very sensitive to experimental image noise, as corrupted orientations will cause the track to 'jump' into adjacent structures, leading to the inference of connections that do not exist in reality. There is therefore a degree of uncertainty about each generated 'track', but the streamlines method provides only a single 'best guess' track, with no further information about its uncertainty or other potential paths. To address this issue, a new class of 'probabilistic' fibre-tracking algorithms was developed by a number of groups, as described for example by Behrens T E J, et al.: "*Non-invasive mapping of connections between human thalamus and cortex using diffusion imaging*", Nature Neuroscience 2003; 6:750-757. These provide a map reflecting the probability of connection to the specified seed point given the level of noise present in the data, thus taking any uncertainty about the orientations into account. It exploits the uncertainty in the data to generate thousands of tracks, the density of which reflects the probability of connection.

Two main ways of performing fibre-tracking can be considered: (i) targeted fibre-tracking, and (ii) whole-brain fibre-tracking. In targeted fibre-tracking, two or more regions-of-interest (ROI) are defined, and tracks that connect between them form a bundle; all other tracks generated are simply discarded. This has obvious limitations. Firstly, it requires significant user interaction (and therefore a potential source of subjectivity and variability). Furthermore, it requires a priori knowledge of the likely connections to select appropriate regions of interest, and typically discards most of the tracks generated. Moreover, connections that were not previously expected will not be identified, which could lead to dangerous misinterpretation of the results. In whole-brain fibre-tracking, on the other hand, tracks are started from many voxels throughout the brain, and no ROIs (seed or target) are required. Therefore, whole-brain fibre-tracking does not rely on the subjective definition of any regions, reducing considerably the user interaction, and making therefore the results less subjective.

Although the diffusion tensor model is still commonly used in the analysis of DWI data, it is now generally accepted that there are serious limitations with this model, in particular in cases where multiple fibre orientations coexist within the same imaging voxel (or 'crossing fibres'). In these cases, the fibre orientations estimates obtained from the diffusion tensor model are incorrect. As a consequence, using this model will often cause the fibre-tracking algorithm to provide an incorrect delineation of the white matter tracts, thus establishing connections where none exists in reality, or failing to identify existing connections.

To address the crossing-fibres problem, a number of alternatives to the diffusion tensor model have been developed for estimating the orientation of the white matter fibres. One of these alternative models is described in Tournier, J.-D., Calamante, F., Connelly, A.: "*Robust determination of the fibre orientation distribution in diffusion MRI: non-negativity constrained super-resolved spherical deconvolution*", NeuroImage 2007; 35, 1459-1472. This approach, known as constrained spherical deconvolution (CSD), involves calculating an estimate of the distribution of fibre orientations (the fibre-orientation distribution, or FOD) present within each voxel, and is thus not limited to a single fibre orientation.

It is therefore desired to address one or more of the above issues or problems, or to at least provide a more useful alternative to existing MRI solutions.

SUMMARY

One aspect of the present invention provides a process for generating enhanced resolution images of fibrous tissue located within a portion of a body being sampled, including:
i) accessing source data representing a distribution of said fibrous tissue orientations within each of a plurality of discrete sample imaging elements defined within said portion based on a first imaging resolution;
ii) generating, based on said source data, streamline data representing a plurality of fibre tracks, each said fibre track representing an estimated path of fibres in said tissue within said portion;
iii) generating an output matrix defining a plurality of discrete output imaging elements within said portion based on a second imaging resolution that provides higher imaging resolution than said first imaging resolution;
iv) generating, for each said output imaging element, image data including intensity data representing a level of intensity based on a number of said fibre tracks at a location corresponding to said output imaging element; and
v) generating display data for controlling a display device to display an enhanced image generated based on said image data.

Another aspect of the present invention provides a system including an image processing module configured for performing a process as described above.

Another aspect of the present invention provides a computer program product, comprising a computer readable storage medium having computer-executable program code embodied therein, the computer-executable program code adapted for controlling a processor to perform a process as described above.

The present invention can be used for generating a 3-dimensional image with arbitrarily high resolution of a fibrous part of the body being imaged, based on a plurality of 3-dimensional curves each representing an estimate of the path of said fibres. Such plurality of 3-dimensional curves may be generated from diffusion-weighted MRI data, consisting of a plurality of 3-dimensional images, each of lower resolution than said arbitrarily high resolution 3-dimensional image. In this context, an image with higher resolution contains a greater number of image elements or voxels, each of which represents a correspondingly smaller volume of the 3-dimensional space. The method may comprise: generating said plurality of 3-dimensional curves from said diffusion data; and generating said high-resolution 3-dimensional image from said plurality of 3-dimensional curves.

The method may further comprise processing said plurality of diffusion-weighted MRI data to generate an estimate of the fibre orientation distribution within each element of a transformed image. This may be achieved using constrained spherical deconvolution techniques.

Generating one estimate of fibre orientation within an element of said transformed image may comprise applying statistical sampling methods to generate one independently sampled orientation from said fibre orientation distribution. Examples of such statistical sampling methods include 'rejection sampling', as described in Mackay D J C: "*Monte Carlo Methods: Rejection Sampling*" Information Theory, Inference, and Learning Algorithms, 6th ed. Cambridge, UK: Cambridge University Press, pp 364-365.

BRIEF DESCRIPTION OF THE DRAWINGS

Representative embodiments of the present invention are herein described, by way of example only, with reference to the accompanying drawings, wherein.

DETAILED DESCRIPTION OF THE REPRESENTATIVE EMBODIMENTS

Figure 1:
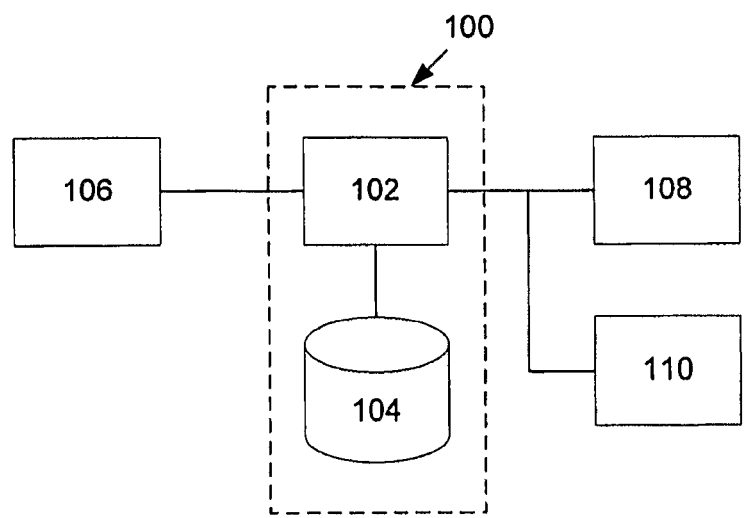
FIG. 1 is a block diagram showing the components of an imaging system.

An image processing system 100, as shown in FIG. 1, includes an image processing module 102 that communicates with a database 104. The database 104 may be any means of local or remote data storage and/or retrieval, including random access memory (RAM), a relational database, or one or more structured (or flat) data files. The image processing module 102 controls the operation of a processing component (e.g. a microprocessor of a standard computer) to perform an imaging process (as described below). The image processing module 102 communicates with the database 104 via a communications channel, such as a communications bus or communications network (such as the Internet, Local Area Network (LAN), or a wireless communications network (e.g. IEEE 802.11a/b/g/n)).

The image processing module 102 may be provided by computer program code (e.g. in languages such as C). Those skilled in the art will appreciate that the processes performed by the image processing module 102 can also be executed at least in part by dedicated hardware circuits, e.g. Application Specific Integrated Circuits (ASICs) or Field-Programmable Gate Arrays (FPGAs).

The image processing module 102 communicates with an imaging device 106, user control interface 108 and display device 110 via one or more communications channels, such as a communications bus or communications network (such as the Internet, LAN, or wireless communications network (e.g. IEEE 802.11a/b/g/n)). The image processing module 102 receives, from the user control interface, user control data including data representing one or more signals, commands, parameters or instructions for controlling the operation of the imaging device 106 and/or any of the modules of the image processing system 100. The user control data may include data representing one or more configuration parameters for updating corresponding configuration parameters represented by the configuration data stored in the database 104. The configuration data includes data representing one or more signals, commands, parameters or instructions (which can be collectively referred to as the configuration parameters) for controlling the operation of the imaging device 106 and/or any of the modules of the image processing system 100.

In a representative embodiment, the imaging device 102 is a magnetic resonance imaging device. The imaging device 106 obtains one or more MRI samples within a portion of a body (e.g. a human or animal body) being sampled. The MRI samples are obtained based on a first imaging resolution, where one or more image samples are obtained at each location corresponding to an input imaging element (e.g. voxel) of a first predetermined size as defined by an input imaging matrix. For example, the first imaging resolution may correspond to a standard imaging resolution of the imaging device 106. The imaging device 106 generates source image data representing one or more different image samples corresponding to a region of a body being sampled generated by the imaging device 106 (e.g. MR images based on the MRI samples obtained of the body by device 106). In a representative embodiment, the source image data is provided to the image processing module 102 for processing. In another representative embodiment, the source image data is stored directly into the database 104 for later processing by the image processing module 102.

The image processing module 102 accesses the source image data from the database 104, and generates image data representing one or more resulting images represented by the source image data (e.g. MR images) in an enhanced resolution (i.e. based on a second imaging resolution that can display finer image detail than the first imaging resolution). In a representative embodiment, the image processing module 102 generates display data for controlling the display device 110 to generate a graphical display interface including an enhanced image generated based on the image data. Alternatively, the image processing module 102 may store the image data in the database 104 for later access, processing or display.

The image processing module 102 can be used to achieve a gain in spatial-resolution (compared to a standard imaging resolution of the imaging performed by the imaging device 106) using post-processing methods to reveal structures beyond the resolution of the acquired imaging voxel. The higher-resolution images with high-anatomical contrast can be generated by combining the information from all DWI data (for the sampled portion of the body), and by incorporating extra information from fibre-tracking modelling. The imaging system 100 uses this form of super-resolution imaging for producing resulting images of significantly higher imaging resolution without a significant decrease in SNR, or associated increase in acquisition time. Advantageously, the imaging system 100 is able to utilise track-density information to generate super-resolution images.

In a representative embodiment of the present invention, a higher-resolution 3-dimensional image of the tissue being imaged is generated, based on the assumed long-range continuity of the fibres within the tissue. For each of the source images (e.g. those obtained using DWI), the information contained in each voxel is independent of the particular spatial location within the voxel (that is, there is no intra-voxel information content and only a single intensity value is available for the whole voxel). The representative embodiment is able to use the long-range continuity information contained in the streamlines to introduce sub-voxel information. For example, a streamline will traverse a given voxel at a particular set of spatial locations within the voxel, thus providing intra-voxel information. When a sufficiently large number of streamlines have been created, their density can then be used as intra-voxel information to construct a super-resolution TDI image with higher spatial resolution than that of the source DWI data. This gain in resolution using streamlines information is a key feature provided by the imaging system 100. A streamline can also be referred to as either a fibre track or track.

In order to generate the TDI maps, the imaging system 100 may perform whole-brain probabilistic fibre-tracking as an initial step (generated by seeding a very large number of tracks throughout the brain). These fibre-tracks provide a representation of the structural connections between the various voxels in the brain. From these fibre-tracks, it is possible to determine a total number of tracks present in each element of a grid, and generate a value stored as signal intensity in the corresponding grid position of the TDI map. The intensity of the TDI map thus represents a measure of the structural connectivity of that element of the grid with all the rest of the brain. The higher the connectivity as measured by fibre-tracking, the higher the intensity of the value in the TDI map. These grid elements can be smaller than the voxel size of the source DWI, and therefore the resolution of the final image map produced by the system 100 can be much higher than that of the DWI data (i.e. improved resolution can be achieved by using the extra information provided by the modelling obtained from fibre-tracking).

The imaging system 100 is able to generate a higher resolution image in the presence of a sufficient number of streamlines. The streamlines may be generated based on probabilistic fibre-tracking techniques. In a representative embodiment, the system 100 performs fibre-tracking with the following main characteristics: (i) it has to generate 3-dimensional curves; (ii) each curve should be defined in a continuous way or, alternatively, be defined by a set of spatial coordinate-points separated by a distance smaller than the desired TDI image resolution (for example, if a 0.25 mm isotropic resolution is desired, the points defining the streamline should be closer than 0.25 mm apart); (iii) a sufficiently large number of streamlines should be generated, that is sufficiently large to populate the grid elements in the super-resolution TDI image with adequate track density; in general terms, the higher the desired TDI resolution (i.e. the smaller voxel), the larger the number of streamlines required.

While the brain itself is a continuous object, the source MRI data only provide a discrete representation of the brain (i.e. discretised by the voxels of the acquired data, with no sub-voxel information). By generating a very large number of fibre tracks (or streamlines), it is possible to generate a continuous representation of the brain (given by the fibre-tracking model). Once this continuous model is generated, the original discrete representation of the brain (i.e. the acquired image) is irrelevant, and the new continuous representation can then be discretised (or mapped) to a resolution much finer than the original image resolution, thus achieving significantly improved resolution (see for example FIGS. 6 to 12 below).

In the representative embodiment of the imaging system 100 shown in FIG. 1, the imaging device 106 can generate source image data based on the water content of the sample portion of the body being imaged. The imaging system 100 may use a specific MRI technique (known as diffusion-weighted MRI) to generate image data, whereby the intensity at each data point (e.g. the location of each voxel defined based on the first imaging resolution) is dependent on the displacement of water molecules due to self-diffusion along a chosen orientation at the corresponding image location. In fibrous tissue, the displacement of these water molecules will on average be smaller when measured across the fibre axis than when measured along the fibre axis, since the arrangement of the fibres is such as to obstruct the free movement of water molecules across them. Using such methods, the system 100 can estimate a distribution of the orientation of the one or more groups of fibres within each voxel of the image. Such orientation information can be represented within each image element as a fibre orientation distribution (FOD), consisting of a distribution over orientation space (alternatively, over the sphere), whereby the amplitude of said distribution along a particular orientation provides an estimate of the density or number of fibres aligned along said orientation.

Figure 2:
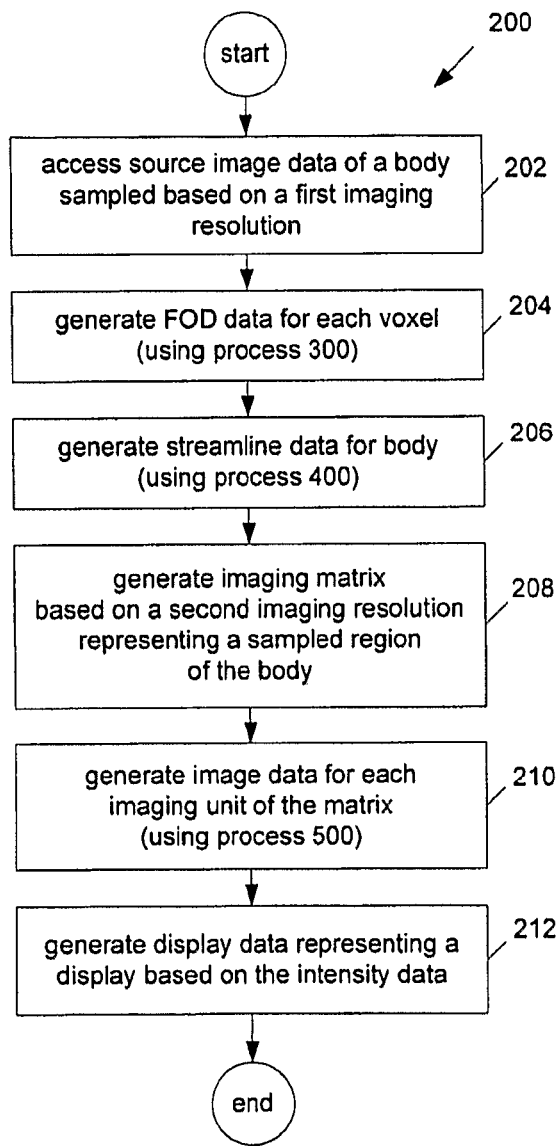
FIG. 2 is a flow diagram of an image enhancement process.

In a representative embodiment, the image processing module 102 generates a fibre track representation based on the source data (representing diffusion-weighted MRI images) as generated by the imaging device 106, and uses the fibre track representation to generate a higher resolution 3-dimensional image of the part of the body being imaged. This processing is shown at a high level in FIG. 2. In general terms, the processing performed in the image enhancement process 200 shown in FIG. 2 is intended to generate a high-resolution 3-dimensional image of the tissue being imaged, based on the assumed long-range continuity of the fibres within the tissue. This is achieved using a suitable model as provided by the fibre-tracking results. The system 100 advantageously allows the initialisation of a TDI image with a user-defined grid size (i.e. an output imaging matrix of a second imaging resolution), and the assignment of image intensity in each of the grid elements in the output imaging matrix based on the information contained on the streamlines positions.

FIG. 2 is a flow diagram of an image enhancement process 200 performed by the image processing system 100 under the control of the image processing module 102. The image enhancement process 200 begins at step 202 with the image processing module 102 accessing source image data of a body sampled based on a first imaging resolution. The source image represents one or more diffusion-weighted MRI images. The source image data may be accessed directly from the imaging device 106 or from the database 104. The imaging device 106 generates the source image data based on the diffusion-weighted MRI image data obtained for a sampled portion of a body based on a first imaging resolution (e.g. using voxels of a first predetermined size). Such data provides a plurality of MRI signal measurements for each of a plurality of voxels, each corresponding to a different spatial location on a 3-dimensional Cartesian grid. A voxel is a volume element, and corresponds to the 3-dimensional equivalent of a pixel in a two dimensional image.

At step 204, the image processing module 102 uses process 300 to generate, based on the source image data, fibre orientation distribution (FOD) data representing a distribution of fibrous tissue orientations with each of a plurality of discrete sample imaging elements (or voxels) defined within the sampled portion of the body based on a first imaging resolution. The FOD data effectively represents an FOD image that consists of a plurality of parameters representing the fibre orientation distribution for each of a plurality of voxels based on a first imaging resolution, each corresponding to the same spatial locations as for the diffusion-weighted MRI image. Equivalently, the fibre orientation image has the same spatial resolution as the diffusion-weighted MRI image.

At step 206, the image processing module 102 uses process 400 to generate, based on the FOD data, streamline data representing a plurality of fibre tracks where each fibre track represents an estimated path of fibres in the tissue with the sampled portion of the body. At step 206, a sufficient number of 3-dimensional curves or streamlines is generated. When a required number of streamlines are generated, processing passes to step 208.

The input data required for step 208 represents a plurality of streamlines, each representing a three-dimensional path within the sampled region of the body. These streamlines may be represented as an ordered plurality of control points, each representing a position within the three-dimensional space, as described above. In an alternative embodiment, the streamlines may be represented by data representing other parameterisations, including one or more polynomial curves, or three-dimensional Fourier descriptors.

These input streamlines may be generated in an incremental tracking manner (as described above). In an alternative embodiment, the data representing these streamlines may be generated using more global approaches, including generating one or more three-dimensional curves in a random fashion and selecting one or more of those generated that best explain or represent the characteristics (e.g. a position, length and/or direction) of one or more fibre tracks or regions based on the source image data. In such approaches, steps 204 and 206 may be performed using an alternative single step.

At step 208, the image processing module 102 generates an output imaging matrix defining a plurality of discrete output imaging elements within the sampled portion based on a second imaging resolution which provides higher imaging resolution than the first imaging resolution. This step involves generating a 3-dimensional output imaging matrix based on user specification (e.g. as defined in the configuration data based on one or more parameters specified by a user) of (i) the orientation of the image axes, and (ii) the number and size of the voxels along each image axis. Each voxel based on the second imaging resolution (as defined by the output imaging matrix) is smaller in size than voxels based on the first imaging resolution (as defined by the input imaging matrix). Each voxel value of the image is then initialised to zero. The 3-dimensional output imaging matrix defines the final output image resolution of the enhanced TDI images produced by the image processing system 100.

At step 210, the image processing module 102 uses process 500 to generate, for each output imaging element of the output imaging matrix, image data including intensity data representing a level of intensity (e.g. a display intensity for a particular colour, or a specific colour within a predetermined range of colours—such as a grey scale) based on a number of fibre tracks at a location corresponding to each respective output imaging element.

At step 212, the image processing module 102 generates display data for controlling the display device 110 to display an enhanced TDI image generated based on the image data.

Figure 3:
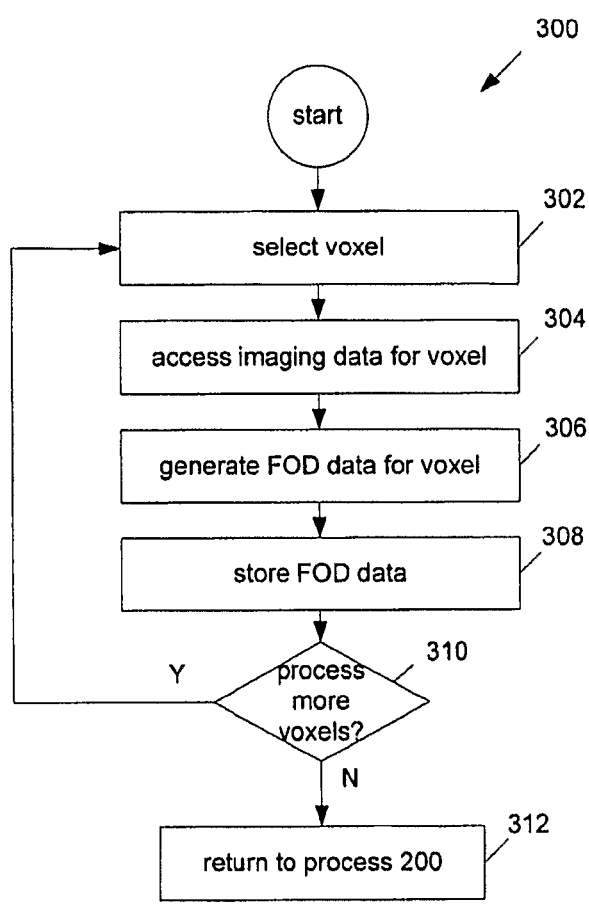
FIG. 3 is a flow diagram of a process for generating fibre orientation data.

FIG. 3 is a flow diagram of a process 300 for generating fibre orientation data, which is performed by the image processing system 100 under the control of the image processing module 102. Process 300 begins at step 302 by the image processing module 102 selecting a voxel used for generating the source data (i.e. at the first imaging resolution) for analysis.

At step 304, the image processing module 102 accesses source image data (i.e. raw diffusion-weighted data) for the selected voxel for processing.

At step 306, the image processing module 102 processes the diffusion-weighted images represented by the source image data to generate, based on the source image data, FOD data representing a transformed FOD image. The FOD image represents the fibre orientation distribution (i.e. an estimate of the distribution of fibrous tissue orientations) within each source imaging element (or voxel) used for sampling the source image data. As described above, the source imaging elements are based on the first imaging resolution. A suitable algorithm is used to generate a representation of the estimated fibre orientation distribution from the raw diffusion-weighted data. In a representative embodiment, a constrained spherical deconvolution algorithm is used, which is described in Tournier J-D, Calamante F, Connelly A: "*Robust determination of the fibre orientation distribution in diffusion MRI: non-negativity constrained super-resolved spherical deconvolution*", NeuroImage 2007; 35, 1459-1472.

At step 308, the image processing module 102 stores the FOD data in the database 104 in association with the corresponding voxel of the FOD image.

At step 310, the image processing module 102 carries out a check to determine whether any voxels remain to be processed. If all voxels have been processed, the processing proceeds to step 312 where control is returned to process 200. Otherwise, process 300 begins processing again at step 302 by selecting a new voxel for processing using process 300.

Figure 4:
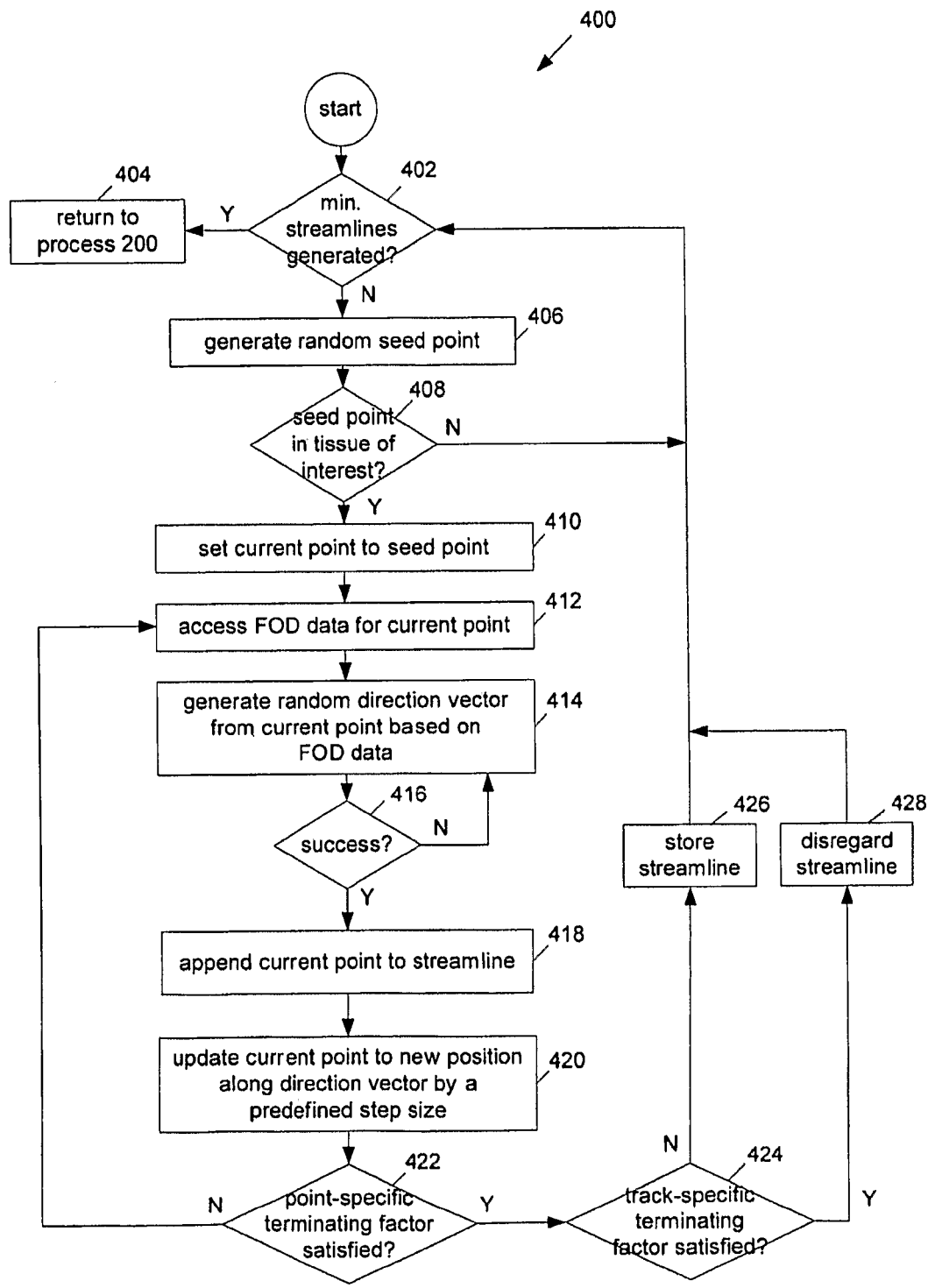
FIG. 4 is a flow diagram of a process for generating streamline data.

FIG. 4 is a flow diagram of a process 400 for generating streamline data, which is performed by the image processing system 100 under the control of the image processing module 102. The process 400 involves using the information from the FOD image generated by process 300 to generate a set of streamlines (also referred to as fibre tracks or tracks). Process 400 begins at step 402, where the image processing module 102 determines whether a total number of fibre tracks generated for the sampled portion is greater than a minimum number of streamlines to be generated by the system 100. The minimum number of streamlines to be generated can be a number represented by the configuration data for the system 100. The check performed at step 402 determines whether a sufficient number of 3-dimensional curves or streamlines have been generated.

If step 402 determines that a total number of fibre tracks generated by the system 100 is greater than a minimum number of streamlines to be generated (e.g. as defined by the configuration data), then control is returned to process 200 at step 404. Otherwise, processing continues to step 406.

At step 406, the image processing module 102 randomly generates (or selects) a seed point corresponding to any location within a 3-dimensional space corresponding to the sampled portion of the body, with equal probability for all possible spatial locations. The spatial locations that can be selected as a seed point may not be limited by the size or resolution of the sample imaging elements (or voxels).

At step 408, a check is carried out to determine whether the point is located within tissue of interest (e.g. a fibrous part of the brain being sampled). This can be carried out by selecting a suitable threshold, such that sampled voxels with a value higher than this threshold are deemed to represent part of the tissue or body being sampled. If this check is unsuccessful, processing returns to step 402 to generate a new random point. In other representative embodiments, other methods can be used to select suitable seed points. Such methods include seeding from a fixed number of points from each voxel in the brain (or tissue being sampled), as described for example in Correia S et al.: "*Quantitative tractography metrics of white matter integrity in diffusion-tensor MRI*", NeuroImage 2008; 42, 568-581, or from a prescribed region in the brain (or tissue being sampled), as described in Conturo T E, et al.: "*Tracking neuronal fibre pathways in the living human brain*", Proc. Natl. Acad. Sci. USA 1999; 96, 10422-10427.

Where the seed point is determined to be located in relevant tissue (e.g. fibrous brain tissue), processing continues to step 410 to begin generating a single streamline from that seed point. The streamline is intended to provide an estimate of the likely path of a group of fibres passing through that location. At step 410, the image processing module 102 sets the current point (for processing) at the same location as the seed point generated at step 406.

At step 412, the image processing module 102 accesses the parameters representing the fibre orientation distribution at the current point as represented by the FOD data stored in the database 104. This step may involve the use of interpolation methods to generate a spatially continuous representation of the fibre orientation distribution, so that the value of the parameters at locations not corresponding to voxel centres can be obtained. Any suitable interpolation method may be used. In a representative embodiment of the present invention, the method used is based on a tri-linear interpolation of each parameter value from the corresponding values for the 8 nearest neighbouring voxels.

In another representative embodiment, other interpolation methods can be used. Such methods can include 'nearest-neighbour' interpolation as described in Mori S et al.: "*Three-dimensional tracking of axonal projections in the brain by magnetic resonance imaging*", Annals of Neurology 2001; 45, 265-269; b-spline interpolation, as in Pajevic S et al.: "*A Continuous Tensor Field Approximation of Discrete DT-MRI Data for Extracting Microstructural and Architectural Features of Tissue*" Journal of Magnetic Resonance 2002; 154, 85-100; and adaptive interpolation using an adaptive kernel, as in Mishra A et al.: "*Unified framework for anisotropic interpolation and smoothing of diffusion tensor images*", NeuroImage 2006; 31, 1525-1535.

In another representative embodiment, the FOD image does not need to be pre-generated (e.g. using process 300), and the FOD values can be calculated directly from the interpolated diffusion-weighted MRI data (as represented by the source data) as part of step 412.

At step 414, the image processing module 102 generates an initial direction vector (or a new direction vector when processing subsequent points) for the streamline based on statistical sampling of the fibre orientation distribution (as represented by the FOD data) in the spatial region adjacent to the current point. Any suitable method to generate samples from a distribution can be used. In a representative embodiment of the invention, rejection sampling is used as described in Mackay D J C: "*Monte Carlo Methods: Rejection Sampling*" Information Theory, Inference, and Learning Algorithms, 6th ed. Cambridge, UK: Cambridge University Press, pp 364-365. Such sampling may be constrained (based on one or more parameters defined in the configuration data) to produce an orientation sample along which the amplitude of the fibre orientation distribution is greater than a user-specified threshold. In certain cases, such orientation may not exist, in which case this step will fail (see step 416).

In another representative embodiment, other statistical sampling methods can be used. Such methods may include drawing one sample from a large pool of samples, previously computed using Monte Carlo Markov Chain methods, as described in Behrens T E et al.: "*Characterization and propagation of uncertainty in diffusion-weighted MR imaging*", Magnetic Resonance in Medicine 2003; 50, pp 1077-1088; and 'bootstrapping' methods, as in Jones D K and Pierpaoli C: "*Confidence mapping in diffusion tensor magnetic resonance imaging tractography using a bootstrap approach*", Magnetic Resonance in Medicine 2005; 53, 1143-1149, and Berman J I et al.: "*Probabilistic streamline q-ball tractography using the residual bootstrap*", NeuroImage 2008; 39, 215-222.

In another representative embodiment, a suitable direction vector can be generated using non-probabilistic methods. Such methods may include finding a peak of the FOD using optimisation methods, or using one of the orientations produced by alternative methods that provide a discrete set of orientations rather than a continuous FOD (e.g. the major eigenvector of the diffusion tensor model). In such cases, the tractography algorithm is no longer deemed to be probabilistic, and may be referred to as a 'deterministic' algorithm.

At step 416, a check is carried out to determine whether step 414 has successfully generated a valid random direction vector for the streamline. If unsuccessful, processing proceeds to step 414 to generate a new direction vector.

If successful, the current point (in this case, its coordinates) is appended to the streamline at step 418. At step 420, the current point is updated by moving it along the current direction vector for the streamline by a small user-defined step size. This step size may be determined using a number of methods. In a representative embodiment, the step size is a constant value specified by the user, which is defined in the configuration data for the system 100. However, other methods can be used to determine the position of the next point, or to control the step size. Such methods include 2nd order and 4th order Runge-Kutta integration, with or without adaptive step size determination, as in Basser P J et al.: "*In Vivo Fiber Tractography Using DT-MRI Data*", Magnetic Resonance in Medicine 2000; 44, 625-632.

At step 422, a check is performed to determine whether an attribute or characteristic associated with the newly updated current point (or the corresponding streamline) satisfies any predetermined point-specific terminating factors for the system 100 (e.g. as defined by the configuration data). If a point-specific terminating factor is satisfied, processing continues at step 424. Otherwise, processing continues at step 412 to obtain FOD data for the updated current point for processing.

In a representative embodiment, step 422 checks if the current point is still within the tissue of interest (the brain in this example), using the same method as described in step 408. If the current point does not relate to relevant tissue of interest (e.g. a region outside of the fibrous tissue of the brain), a point-specific terminating factor is satisfied and the streamline is terminated. In the context of step 422, termination of a streamline means that all points associated with the current streamline generated prior to the current point will be used to representative the current streamline (i.e. the current point will not be associated with the current streamline, or is simply disregarded, and no further points will be added to the streamline).

In another representative embodiment, the image processing module 102 may use one or more other methods (i.e. based on one or more point-specific terminating factors) to determine whether a streamline should be terminated (i.e. that the current point should not be associated with the current streamline, or be disregarded), including one or more of the following:

terminating the streamline at the current point where it is considered to have left the tissue of interest, such as when an amplitude of a marker of the current point being within white matter falls below a predetermined distribution threshold value (e.g. disregarding position data for the current point if a level of distribution of fibre orientations at the location of the current point in the portion falls below a predetermined distribution threshold value). The data corresponding to the marker may be an absolute or mean amplitude of one or more FOD data values along the current direction of the streamline. The predetermined distribution threshold value may be predetermined based on one or more FOD data values representative or characteristic of a region substantially containing cerebro-spinal fluid;

terminating the streamline at the current point when the curvature of the streamline (e.g. taking into account the new point and two or more recently added points of the streamline) exceeds a predetermined angular threshold value (e.g. disregarding the position data for a new point if a curvature of the current point relative to two or more other existing said points of the fibre track exceeds a predetermined curvature threshold value);

terminating the streamline at the current point when the diffusion anisotropy is below a predetermined diffusion threshold value (e.g. disregarding the position data for the current point if a level of diffusion anisotropy adjacent to the new point is below a user-specified diffusion threshold value); and terminating the streamline at the current point when the streamline becomes longer than biologically plausible (e.g. disregarding the position data for the current point if a total length of the streamline exceeds a predetermined maximum length threshold).

At step 424, a check is performed to determine whether an attribute or characteristic associated with the streamline being processed satisfies any predetermined track-specific terminating factors for the system 100 (e.g. as defined by the configuration data). If a track-specific terminating factor is satisfied, processing continues to step 428 where all position data associated with the streamline currently being processed is disregarded from the streamline data. Otherwise, processing continues to step 426 where the position data for the streamline currently being processed in stored in the database 104.

In a representative embodiment, step 424 involves checking whether the current streamline is of an appropriate length. For example, the track-specific terminating factors may include:

terminating a streamline when the length of the streamline is less than a predetermined (e.g. user-specified) minimum length threshold value (e.g. disregarding the streamline data for a selected fibre track where a total length of the selected fibre track is less than a predetermined minimum length threshold value).

In the above example, if step 424 determines that a total length of the streamline falls below a minimum length threshold value, then all position data associated with the streamline currently being processed is disregarded from the streamline data. Otherwise, the streamline data for the current streamline is stored (in database 104) as part of the streamline data for the source image data being processed. Processing then continues at step 402.

It can be appreciated that iteration of steps 412 to 422 generates a sequence of points (or data representing position coordinates for each of these points within the sampled portion of the body) that represent a 3-dimensional curve, corresponding to an estimate of the path of a group of fibres. In other representative embodiments of the invention, streamlines may be generated bi-directionally. In other words, the loop encompassing steps 412 to 422 may be performed twice, first in an initial path direction, and then repeated for the opposite path direction. This procedure enables a streamline to be generated in both directions from the same seed point.

Figure 5:
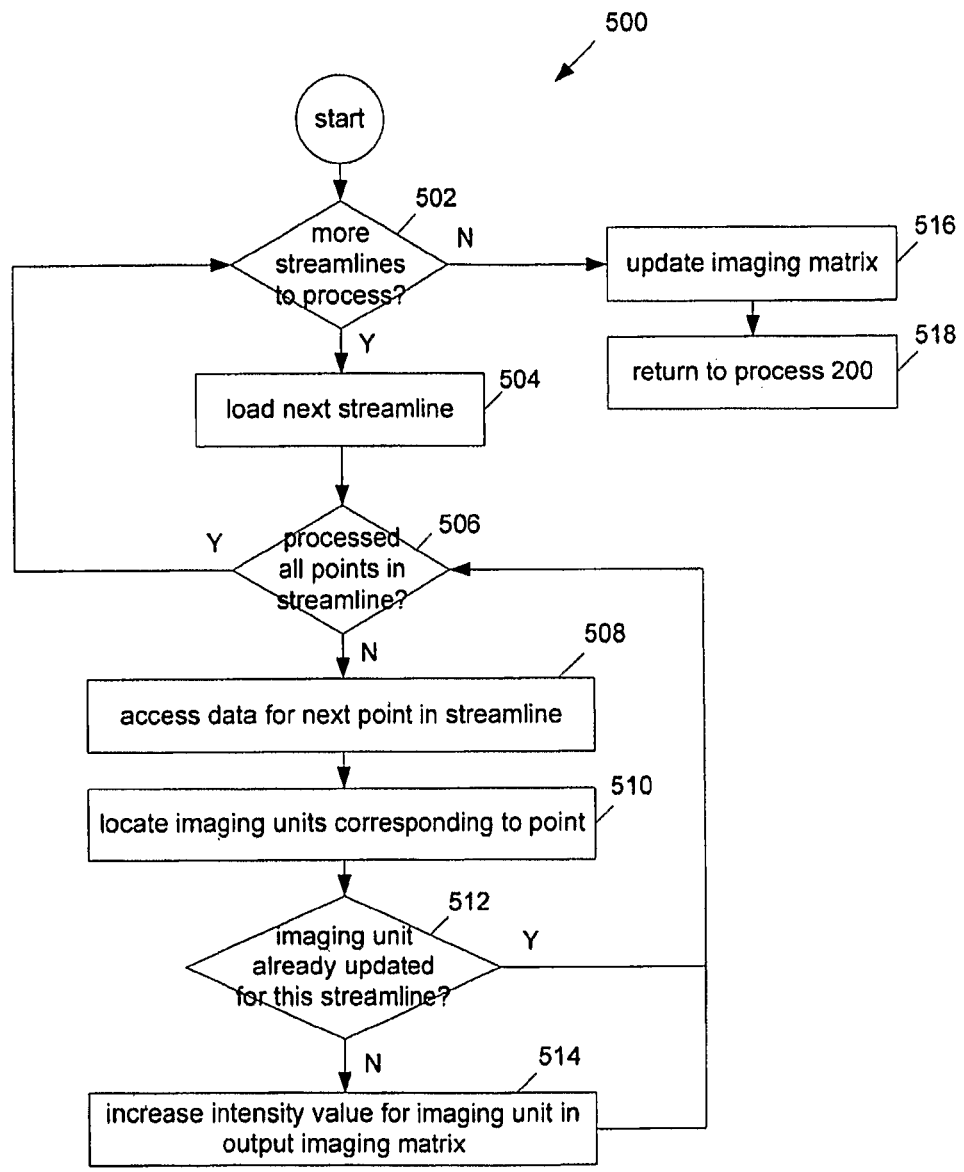
FIG. 5 is a flow diagram of a process for generating image data.
Figure 6:
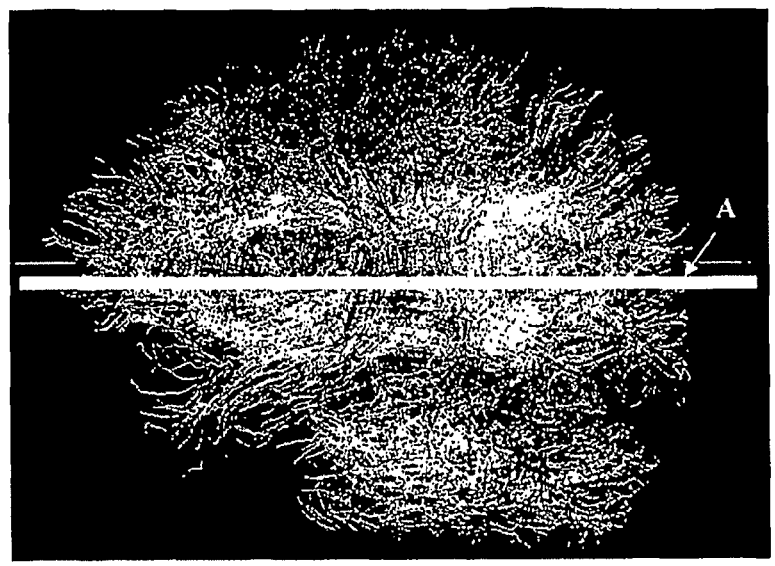
FIG. 6 is an image representing the fibre tracks of a brain along a sagittal plane.
Figure 7:
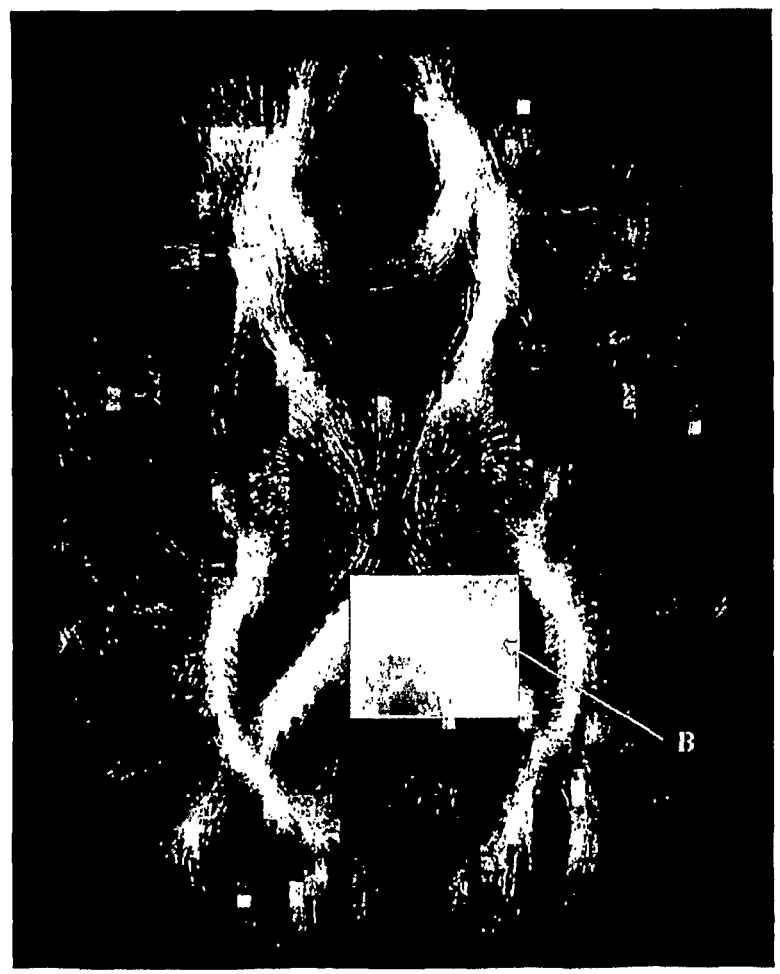
FIG. 7 is an image representing the fibre tracks slice A of FIG. 6 along an axial plane superimposed on a corresponding FA map generated at a first imaging resolution.
Figure 8:
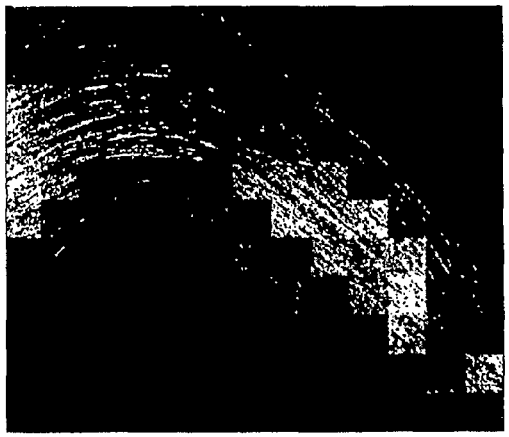
FIG. 8 is a magnified image of region B in FIG. 7.

FIG. 5 is a flow diagram of a process for generating enhanced image data, which is performed by the image processing system 100 under the control of the image processing module 102. It will be appreciated that the steps in process 500 enable the system 100 to generate an increasingly accurate track density image (TDI), at the resolution specified by the output imaging matrix. This allows the system 100 to generate a super-resolution image.

The process 500 beings at step 502, where the image processing module 102 determines if there are further streamlines to be processed. If so, the processing continues at step 504. Otherwise, processing continues at step 516, where the output imaging matrix is updated to incorporate data including the intensity data representing an intensity value corresponding to each of the output imaging elements (or voxels) defined in the output imaging matrix. The output of step 516 is image data representing a high-resolution track density image (TDI) map. After step 516, control is returned to process 200 at step 518.

Step 504 retrieves the streamline data for the next streamline from the database 104. Process 500 then proceeds to update the output imaging matrix (representing a high-resolution track density image) based on the streamline data.

At step 506, the image processing module 102 checks to see if all the points of the streamline selected at step 504 have been processed. If so, processing continues at step 502 to select a new streamline for processing (if any still remain unprocessed). Otherwise, processing continues at step 508 with the image processing module 102 accessing (from the database 104) the data for a next point of the streamline.

At step 510, the output imaging element (or voxel) of the output imaging matrix nearest to the current point (selected at step 508) is identified. At step 512, a check is carried out to determine whether the output imaging element identified at step 510 has already been updated for the particular streamline currently being processed. This is to ensure that the streamline cannot be counted more than once for each output imaging element (i.e. once per voxel). If step 512 determines that the output imaging element has already been updated, processing returns to step 506 to select a next point of the same streamline. Otherwise, processing continues at step 514 to update data (including intensity data) associated with the identified output imaging element. Intensity data represents an intensity value representing a level of intensity.

An intensity value for the identified output imaging element (as represented by the intensity data for that element) is incremented by one. Processing then returns to step 506. It can be appreciated that iteration of step 502 to 514 increase the value of each output imaging element (or voxel) of the output imaging matrix that has been visited by the streamline.

In other representative embodiments, other methods may be used to update each nearest voxel in the track density image. Such methods include incrementing the value for that voxel by one for all relevant points, regardless of whether it has already been updated for that track.

To facilitate comparison between the intensity values in TDI maps generated from different conditions (for example, from different total number of streamlines, different voxel resolution, etc), the intensity of the map can be scaled to compensate for these effects. For example, in a representative embodiment, a total number of streamlines traversing a voxel (T) is divided by a total number of streamlines stored (N), in order to generate a fraction (or density) of streamlines in each voxel: T/N. Other scaling can be also used. For example, in an alternative embodiment of the invention, the fraction of the total number of tracks can be divided by the volume of the voxel element (V): T/(N×V). In other representative embodiments, the update of the track density image for each streamline is performed immediately after the streamline is generated, rather than in a separate loop. This can remove the need to store the streamlines, reducing storage requirements.

In other representative embodiments of the invention, the imaging processing module 102 can generate TDI maps modified to incorporate information of the directionality of the fibrous tissue encoded by colour. For example, this may be achieved by assigning a colour to each spatial direction. For example, a first colour (e.g. red) may be used to represent portions of streamlines extending along a left-right direction, a second colour (e.g. green) may be used to represent portions of streamlines extending along an anterior-posterior direction, and third colour (e.g. blue) may be used to represent portions of streamlines extending along an inferior-superior direction. In each voxel element of the high resolution TDI map, the colour can be assigned by generating an average of the colours of all the streamlines contained within the voxel. In another representative embodiment, a mean colour can be calculated in alternative ways, such as by generating an average of the directions of all streamlines contained within the voxel prior to computing the colour. Once this mean direction is calculated, the right-left component of the mean direction is set to the first (e.g. red) colour, the anterior-posterior component to the second (e.g. green) colour, and the superior-inferior component to the third (e.g. blue) colour. Colour data representing a colour associated with the directional alignment of a portion of relevant streamline may be generated by the image processing module 102 at 514 of process 500.

In Vivo Examples

Figure 9:
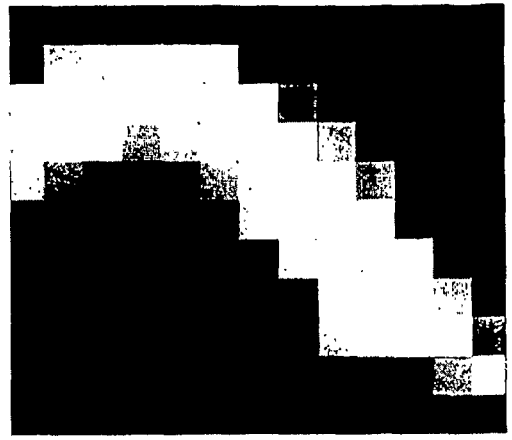
FIG. 9 is an image representing a track density image (TDI) map for region B in FIG. 7 at a first imaging resolution.
Figure 10:
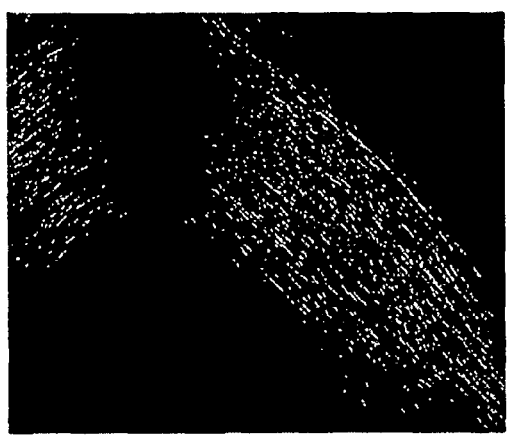
FIG. 10 is an image representing fibre tracks for region B in FIG. 7.
Figure 11:
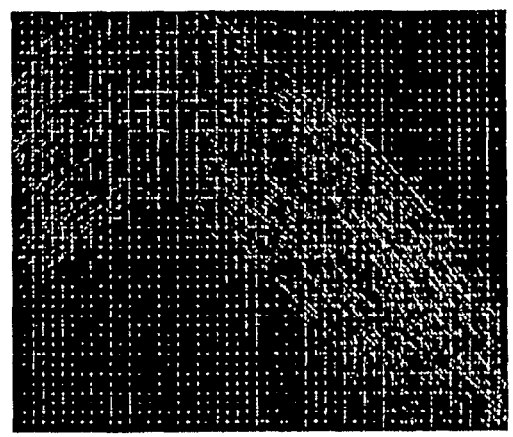
FIG. 11 is an image representing the fibre tracks in region B in FIG. 7 superimposed on an output imaging matrix defined based on a second imaging resolution.
Figure 12:
FIG. 12 is an enhanced TDI map generated based on the fibre tracks in region B in FIG. 7 and the output imaging matrix shown in FIG. 11.
Figure 13:
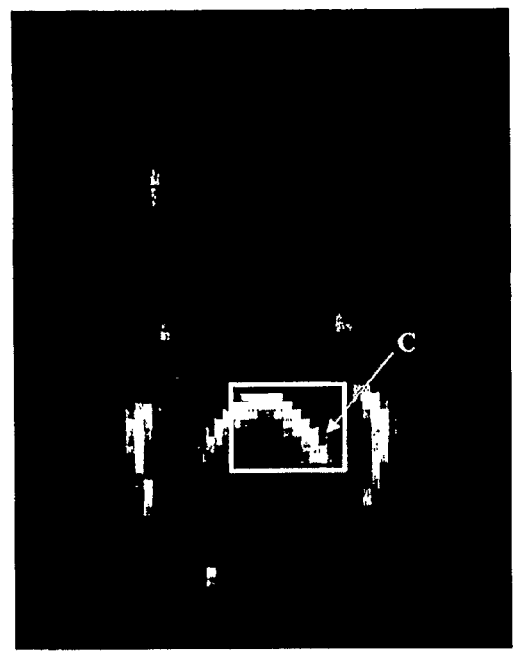
FIG. 13 is a TDI map of a region of a brain along an axial plane generated based on a first imaging resolution of 2.3 mm isotropic resolution.
Figure 14:
FIG. 14 is a magnified image of region C in FIG. 13.
Figure 15:
FIG. 15 is an enhanced TDI map generated based on the fibre tracks in region C in FIG. 13 and a second imaging resolution of 0.125 mm isotropic resolution.
Figure 16:
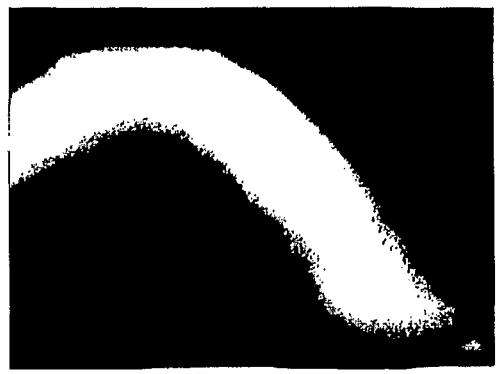
FIG. 16 is a magnified image of region C in FIG. 13 displayed using linear interpolation.
Figure 17:
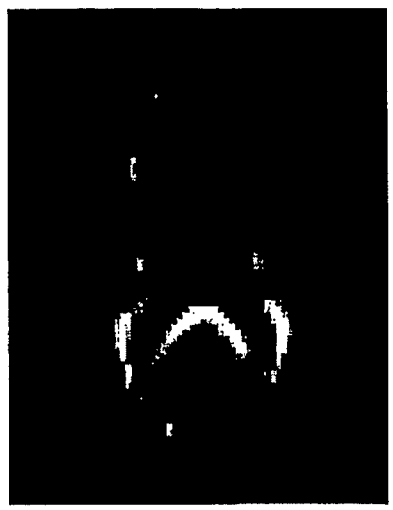
FIGS. 17 to 20 are TDI maps of the slice shown in FIG. 21 generated at isotropic imaging resolutions of 2.3 mm, 1 mm, 0.5 mm and 0.25 mm respectively.
Figure 18:
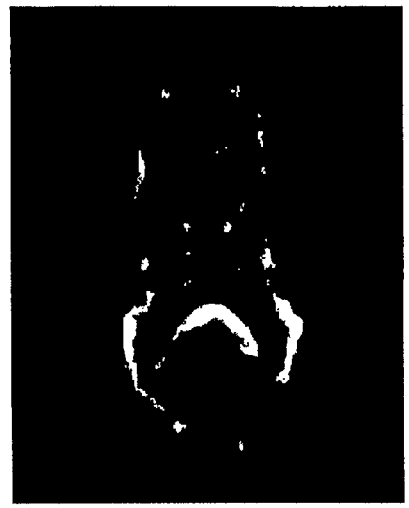
Figure 19:
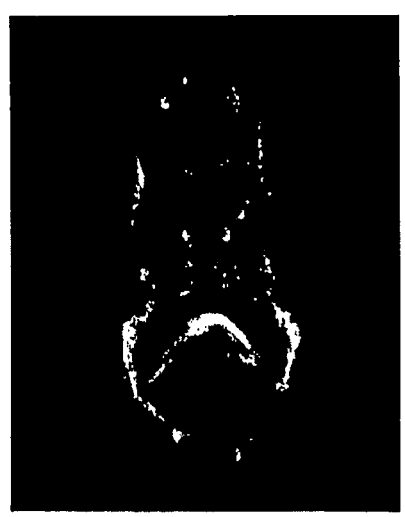
Figure 20:
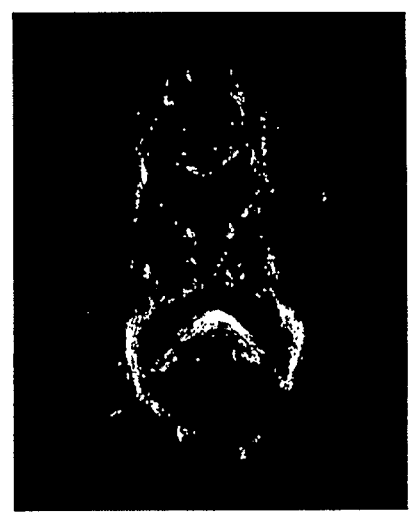

FIGS. 6 to 12 shows a schematic illustration of the principles of the method to generate the higher-resolution TDI map utilised by the system 100. By counting the fibre-tracks in each voxel (in this particular case, a 2.3 mm isotropic voxel resolution), it is possible to generate a track-density imaging (TDI) map, as shown in FIG. 9. Note that this map has the same spatial resolution as that of the source images (that is, 2.3 mm). To achieve higher-resolution, one must notice that, once the fibre-tracks have been created, they can be considered in isolation, independent of the initial resolution of the source data. It is now therefore possible to overlay to the tracks a grid of arbitrary size. By counting the fibre-tracks in each of these new grid elements, it is possible to generate a higher-resolution TDI map, as shown in FIG. 12. Note that this map has higher-resolution (in this particular example, 0.5 mm isotropic) than that of the source images (that is, 2.3 mm isotropic). FIGS. 8 to 12 visually illustrates a key processing step performed by the system 100.

The gain in spatial-resolution achieved using the proposed methodology should not be confused with the visual effect achieved using standard image interpolation: interpolation does not provide any extra information and it has mainly a 'cosmetic' role. This distinction is illustrated in FIGS. 13 to 16, which shows a comparison of the effect of super-resolution vs. the standard image interpolation. As shown by these figures, the super-resolution method leads to a real gain in spatial resolution, not achievable by interpolation.

Figure 21:
FIG. 21 is a conventional high-resolution anatomical MR image of an axial slice of a brain.
Figure 22:
FIG. 22 is a FA map of the slice in FIG. 21 interpolated to 1 mm isotropic resolution.

To illustrate the gradual increase in spatial resolution and information content achievable with the proposed invention, FIGS. 17 to 20 show examples of TDI maps generated with increasing spatial resolution, that is with decreasing grid-size: with isotropic grids of 2.3 mm (the original source resolution for this subject), 1 mm, 0.5 mm and 0.25 mm respectively for FIGS. 17 to 20. For comparison, FIGS. 21 and 22 shows a conventional high-resolution anatomical MR image (MPRAGE) and the FA map (interpolated to 1 mm isotropic resolution) for the same slice locations as shown in FIGS. 17 to 20.

Figure 23:
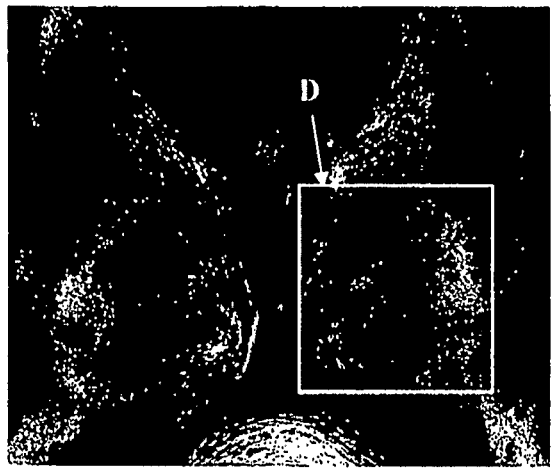
FIGS. 23 to 25 respectively correspond to (i) an enhanced TDI map generated by the system for a sampled axial region of a brain, (ii) FA map of the selected region, and (iii) conventional high-resolution anatomical MR image of the selected region.
Figure 26:
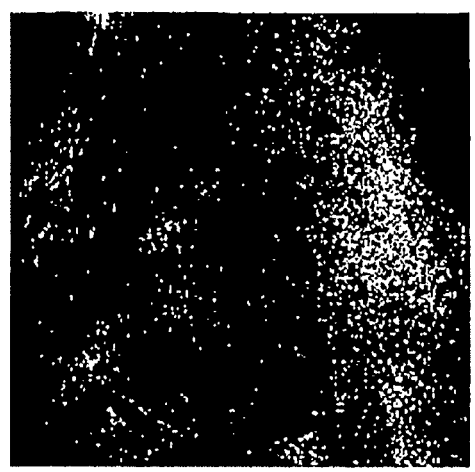
FIGS. 26 to 28 are magnified images corresponding to regions D, E and F of FIGS. 23 to 25 respectively.
Figure 24:
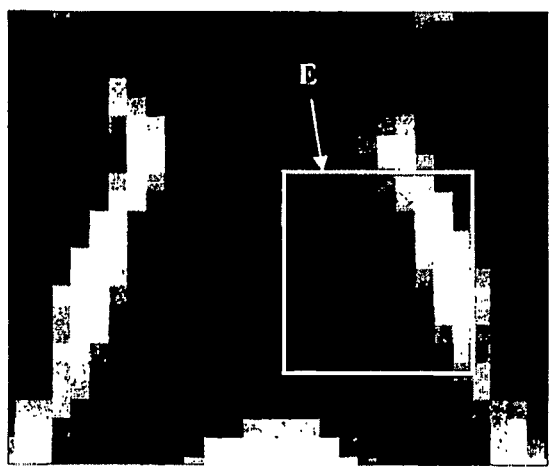
Figure 27:
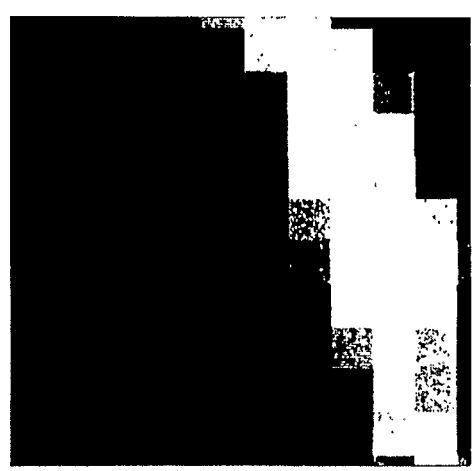
Figure 25:
Figure 28:
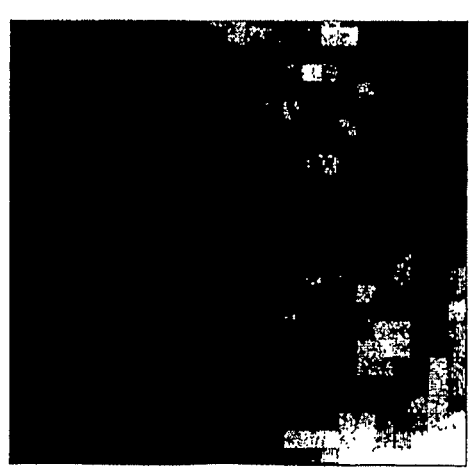

FIGS. 23 to 28 show examples of the increase in spatial resolution and information content achieved using super-resolution TDI. FIGS. 23 to 25 respectively correspond to (i) an enhanced TDI map generated by the system for a sampled axial region of a brain, (ii) FA map of the selected region, and (iii) high-resolution anatomical MR image of the selected region. FIGS. 26 to 28 are magnified images corresponding to region D (generated from 2,500,000 fibre tracks with an isotropic grid resolution of 0.125 mm), region E (with native resolution of 2.3 mm) and region F (with 1 mm resolution) of FIGS. 23 to 25 respectively. As shown in FIGS. 23 to 28, the super-resolution TDI method allows a massive increase in the spatial resolution achievable with MRI, providing exquisite anatomical information not previously available in vivo.

Figure 29:
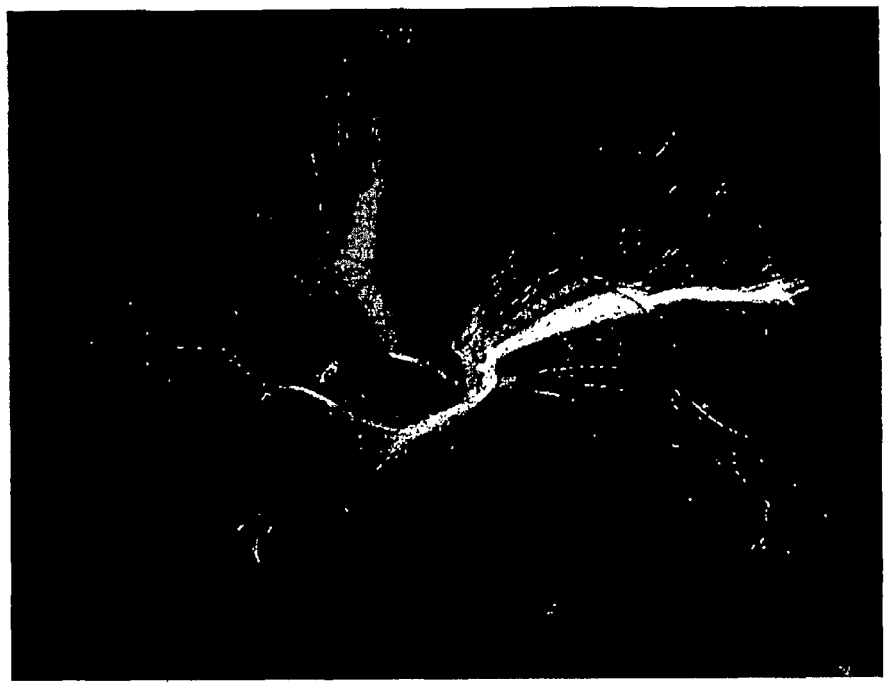
FIG. 29 is an image representing a sagittal view of portion of the fibre tracks generated for a brain.
Figure 30:
FIG. 30 is an image representing an axial TDI map showing the structural tissues features of a thalamus region of the brain represented in FIG. 29.
Figure 31:
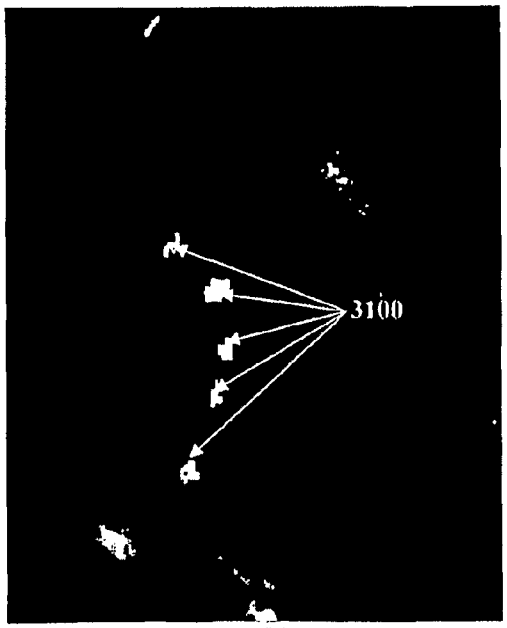
FIG. 31 is an image seed points 3100 identified based on the TDI map in FIG. 30.
Figure 32:
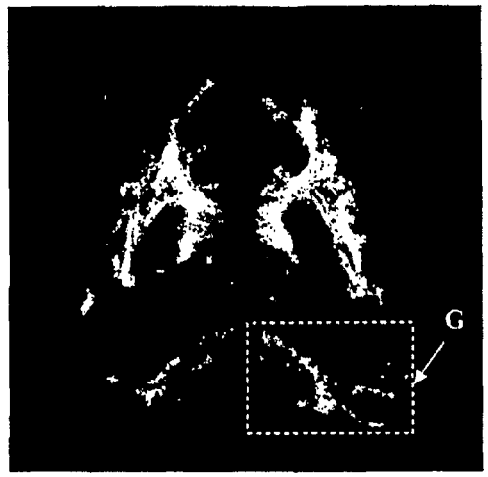
FIG. 32 is a coronal TDI map of a brain.
Figure 33:
FIG. 33 is a conventional high-resolution anatomical MR image corresponding to FIG. 32.
Figure 34:
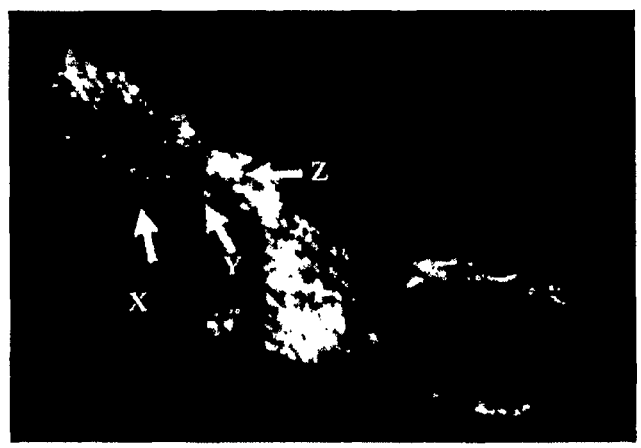
FIG. 34 is a magnified image of region G in FIG. 32.
Figure 35:
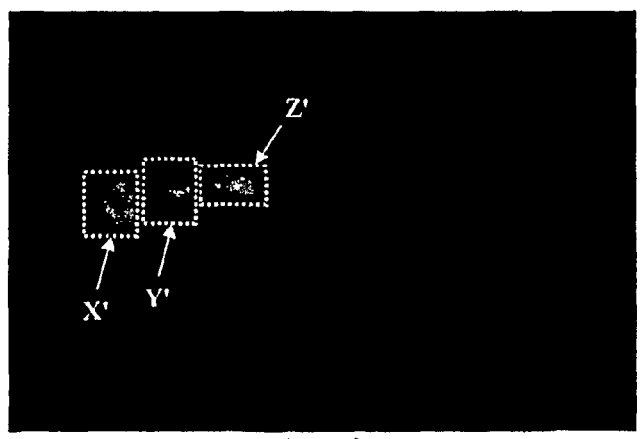
FIG. 35 is an image (on the same coronal plane as FIG. 32) showing the results X', Y' and Z' of targeted fibre tracking from seed points X, Y and Z in FIG. 34.
Figure 36:
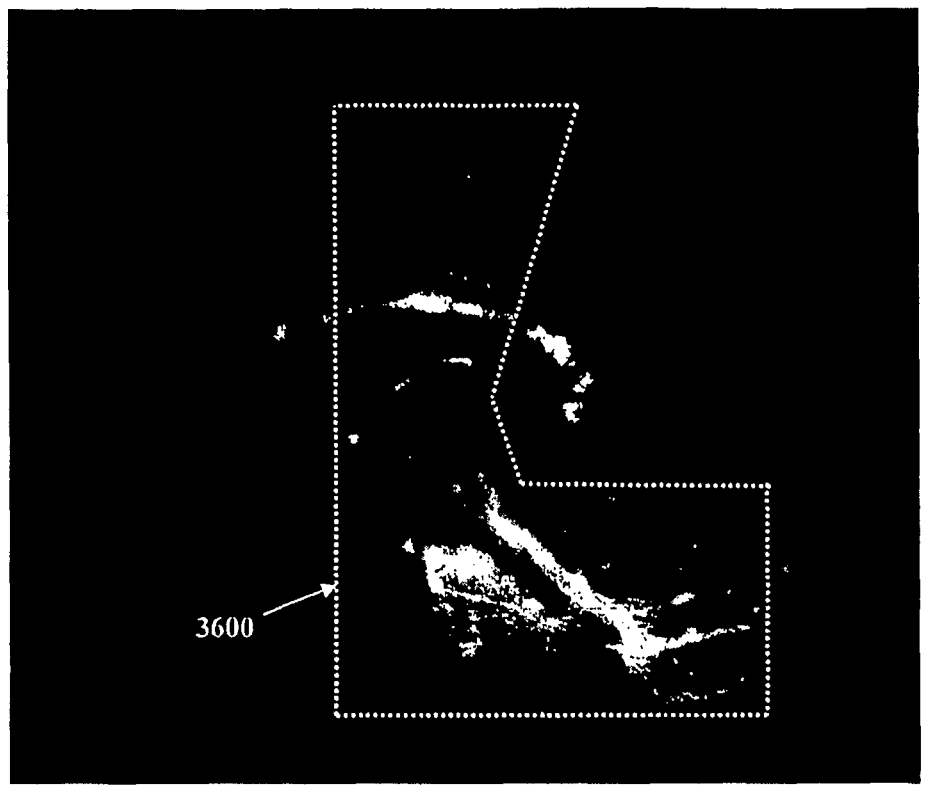
FIG. 36 is a sagittal TDI map of the brain represented in FIG. 32 overlaid with the results of targeted fibre tracking 3600 (X', Y' and Z') from seed points X, Y and Z in FIG. 34.
Figure 37:
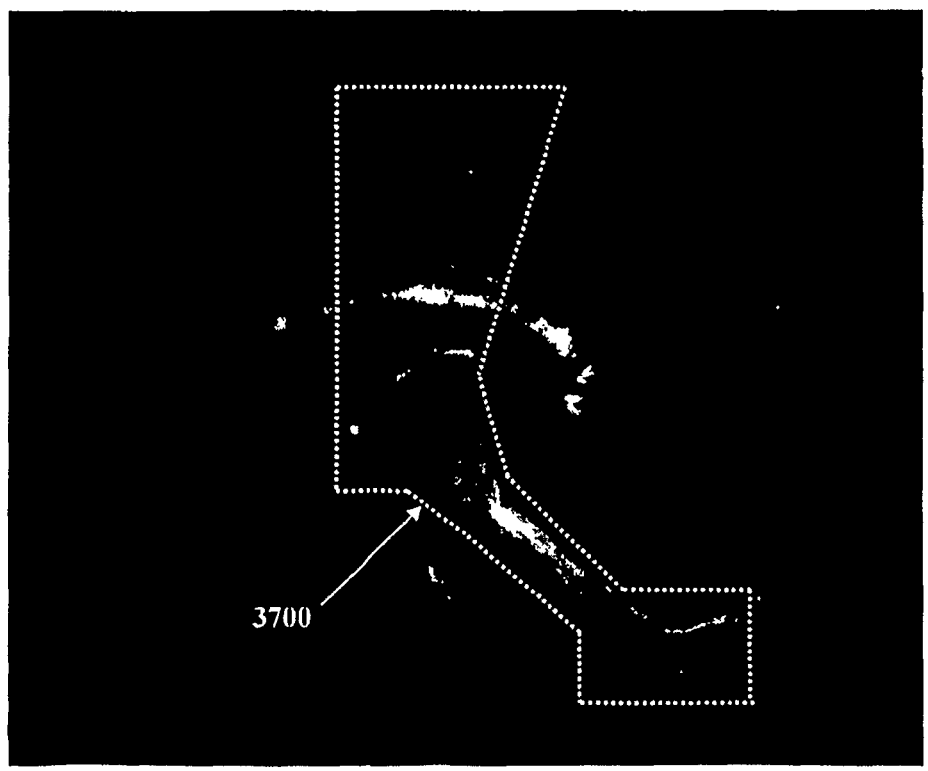
FIGS. 37 to 39 are sagittal TDI maps of the brain represented in FIG. 32 overlaid with the respective results of targeted fibre tracking X', Y' and Z' from seed points X, Y and Z in FIG. 34 respectively.
Figure 38:
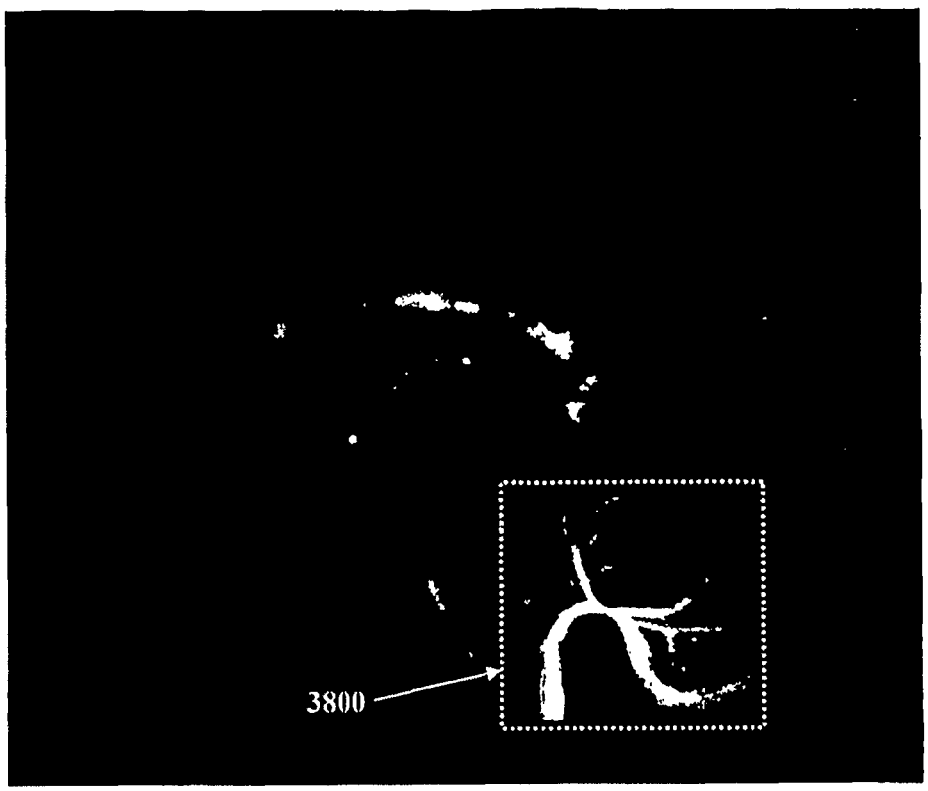
Figure 39:
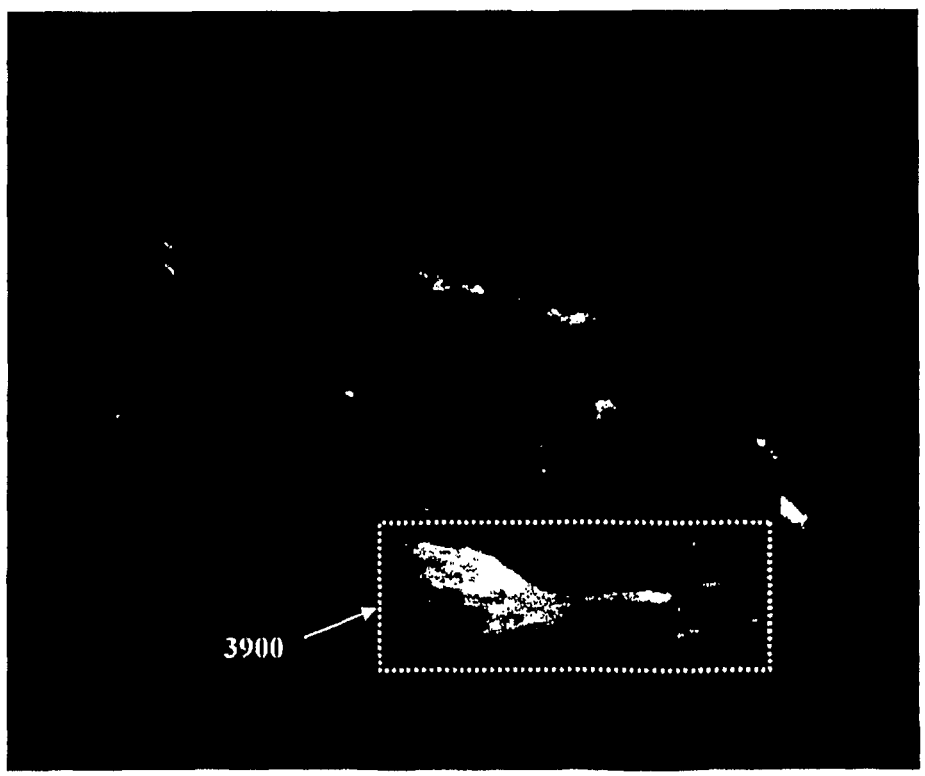

The exquisite contrast of the super-resolution maps enables highly-specific targeted fibre-tracking analysis. This is illustrated in FIGS. 29 to 31, which shows an example of the potential use of the TDI maps to complement targeted fibre-tracking (in this case targeted tracking from 7 small seed ROIs 3100 defined in areas identified in the high-contrast TDI maps).

FIGS. 32 to 39 shows an example of the gain in anatomical information achieved using TDI maps, in this particular case to directly visualise the various cerebellar peduncles. The TDI map allows direct visualisation of 3 distinct white matter regions (see arrows X, Y and Z), which correspond to the superior (SCP), middle (MCP) and inferior cerebellar peduncles (ICP). To corroborate these assignments, the maps were used to define a separate seed-ROI in each of these structures in order to perform targeted fibre-tracking (1,000 tracks/seed region). As can be seen in the tracking results (FIGS. 36 to 39), the various connections are consistent with the known anatomical connections of the three cerebellar peduncles.

The system 100 may incorporate directionality information to TDI maps by using colour-coding. The map may be created by assigning a colour to each spatial direction (e.g. red: left-right, green: anterior-posterior, and blue: inferior-superior) in each voxel element of the high-resolution TDI map, where the colour can be assigned based on a mean direction of all the streamlines contained within the voxel.

All the in-vivo examples shown in FIGS. 6 to 39 were generated based on MRI data acquired from a healthy human volunteer on a 3T Siemens Trio system. The DWI data were acquired using a twice-refocused spin-echo EPI sequence, with the following relevant imaging parameters:

| | |
|---|---|
| Number of DW sensitising directions: | 150 |
| Degree of DW sensitisation (b-value): | 3,000 s/mm$^2$ |
| Number of slices (contiguous): | 54 |
| Slice thickness: | 2.3 mm |
| Echo-time (TE): | 106 ms |
| Repetition time (TR): | 7.4 s |
| Matrix size: | 104 × 104 |
| Field of view (FOV): | 24 × 24 cm$^2$ |
| Voxel resolution: | 2.3 × 2.3 × 2.3 mm$^3$ |

A b-value=0 volume (that is, a DWI data-set without DW sensitisation) was acquired first, and repeated after every 10 DWI-volumes. A conventional 3-dimensional high-resolution anatomical image (in particular, a magnetization-prepared rapid-acquisition with gradient-echo (MPRAGE) data-set) was also acquired for anatomical reference (voxel size 1×1×1 mm$^3$, TE=1.6 ms, TR=1.9 s, inversion-time (TI)=0.9 s, flip-angle=9°.

The imaging system 100 can have a variety of applications, including:

Anatomical assessment: the increased spatial resolution achieved using TDI and the exquisite anatomical contrast contained in the maps could be greatly beneficial for anatomical assessment and visualisation of brain structures, both in normal and abnormal brain states (see for example FIGS. 17 to 39 below).

Comparison of normal and abnormal cases: the high-resolution and high-contrast images produced using TDI could be used to compare data created from normal and abnormal cases (for example, in normal subjects and in patients with brain disorders), and thus to identify brain image differences between the two cases.

Guide for targeted fibre-tracking: (see for example FIGS. 29 to 39 below) the TDI maps could also play a very important complementary role in fibre-tracking studies. The TDI maps provide an ideal tool for guiding placement of ROI in targeted fibre-tracking investigations: provided a very large number of tracks are used to generate the TDI maps (of the order of several hundred thousands to several million tracks), the TDI maps identify the white matter areas in which the fibre-tracking algorithm is most likely to identify tracks in a given DWI data-set. Therefore, they not only have high-resolution and high-contrast, but can be used to delineate the specific regions in which tracks are expected to be present.

Spatial normalisation: the high spatial information content of the TDI maps makes them particularly suitable candidates as scalar images for use in inter-subject normalisation of brain images (that is, to transform images from different subjects to a common space).

Characterisation of the directionality of the fibrous tissue: by incorporating colour-coding to the TDI maps in an analogous manner to the directionally-encoded colour map (DEC) in diffusion tensor imaging, the proposed method could provide a high spatial-resolution representation of the directionality of the fibres in the tissue, beyond the practical resolution previously feasible using DEC maps. It should be noted that, while the tensor-based DEC map concept has been already described, colour-coded TDI mapping is not based on the same principle (see section "Directionality information by colour-coded TDI map").

Data reduction tool: whole-brain probabilistic fibre-tracking methods produce a massive amount of complex information, generating hundreds of thousands (or in some cases even millions) of tracks. Each of these tracks is usually represented by a large set of 3-dimensional coordinates in space. The information content of these files can be therefore enormous (for example, a 1-million fibre-tracking data-set can produce an approximately 8-gigabyte file size). The TDI mapping could be used as data reduction tool to summarise the information content using a much smaller file (for example, with an approximately 0.4-gigabyte file size for a 0.25 mm isotropic spatial resolution map).

Tool to create high-resolution brain atlas: the exquisite contrast and spatial resolution achievable using the TDI maps make them an ideal tool to create an atlas of brain structures in a completely non-invasive manner.

Modifications and improvements to the invention will be readily apparent to those skilled in the art. Such modifications and improvements are intended to be within the scope of this invention.

In this specification where a document, act or item of knowledge is referred to or discussed, this reference or discussion is not an admission that the document, act or item of knowledge or any combination thereof was at the priority date, publicly available, known to the public, part of common general knowledge; or known to be relevant to an attempt to solve any problem with which this specification is concerned.

The word 'comprising' and forms of the word 'comprising' as used in this description and in the claims does not limit the invention claimed to exclude any variants or additions.

The invention claimed is:

1. A process for generating enhanced resolution images of fibrous tissue located within a portion of a body being sampled, said method including:
    i) accessing source data representing a distribution of said fibrous tissue orientations within each of a plurality of discrete input voxels defined within said portion based on a first imaging resolution as defined by an input imaging matrix;
    ii) generating, based on said source data, input streamline data of a first data structure type representing a plurality of fibre tracks, each said fibre track representing an estimated path of fibres in said tissue within said portion;
    iii) generating, based on said input streamline data, a three-dimensional output imaging matrix of a second data structure type defining a grid of discrete output voxels within said portion based on a second imaging resolution that provides higher imaging resolution than said first imaging resolution;
    iv) generating, for each said output voxel, image data including intensity data representing a level of intensity based on a number of said fibre tracks at a location corresponding to said output voxel; and
    v) generating display data for controlling a display device to display an enhanced image generated based on said image data.

2. A process as claimed in claim 1, wherein the source data specific to each said input voxel includes data representing an estimate of said distribution based on a plurality of diffusion weighted data samples of said body at a location corresponding to the respective input voxel, said diffusion weighted data samples being generated based on a magnetic resonance imaging process.

3. A process as claimed in claim 1, wherein the input streamline data specific to each respective one of said fibre tracks includes position data representing a set of coordinates for each of a plurality of different points defining a position of said estimated path within said portion.

4. A process as claimed in claim 3, wherein generating said input streamline data for a selected one of said fibre tracks includes at least one of:
   i) generating said position data representing a randomly selected seed point within said portion as a first point of said estimated path for said selected fibre track; and
   ii) generating said position data representing a new point of said estimated path for said selected fibre track based on a spatial relationship between said new point and one or more existing points of said estimated path.

5. A process as claimed in claim 4, wherein said spatial relationship is defined by one or more of the following characteristics:
   i) said new point being within a predetermined step distance away from a closest end point of said selected fibre track;
   ii) said new point being within a predetermined step distance away from a closest end point of said selected fibre track, wherein said predetermined distance is a value determined based on a dimension of said output voxel;
   iii) said new point rests along a randomly generated directional axis extending from said end point; and
   iv) said new point rests along a randomly generated directional axis extending from said end point, wherein said directional axis is within a predetermined angular deviation threshold relative to a reference axis defined based on the coordinates for one or more said existing points of said selected fibre track.

6. A process as claimed in claim 3, wherein said input streamline data is generated subject to a predetermined point-specific terminating conditions, including one or more of the following:
   disregarding said position data for said new point if a level of said distribution of said fibre orientations at the location of said new point in said portion falls below a predetermined distribution threshold value;
   disregarding said position data for said new point if a curvature of said new point relative to other existing said points of said fibre track exceeds a predetermined curvature threshold value;
   disregarding said position data for said new point if said distribution of said fibre orientations at the location of said new point in said portion falls below a predetermined distribution threshold value;
   disregarding said position data for said new point if a diffusion anisotropy adjacent to said new point is below a user-specified diffusion threshold value; and
   disregarding said position data for said current point if a total length of said selected fibre track exceeds a predetermined maximum length threshold.

7. A process as claimed in claim 3, wherein said input streamline data is generated subject to a track-specific terminating condition, including disregarding said input streamline data for said selected fibre track where a total length of said selected fibre track is less than a predetermined minimum length threshold value.

8. A process as claimed in claim 1, wherein said image data includes one or more of:
   colour data representing a selected colour associated with each segment of said estimated path for a selected one of said fibre tracks, said colour for each said segment being selected based on an alignment of a direction of said segment relative to one or more predefined sampling reference axes; and
   intensity data represents an intensity value representing said level of intensity, and said process includes increasing said intensity value based on a count of a number of said fibre tracks at a location corresponding to a respective said output voxel.

9. A process as claimed in claim 8, wherein said sampling reference axes include:
   i) a first axis extending along a sagittal plane of said body, said first axis being associated with a first colour;
   ii) a second axis extending along a coronal plane of said body, said second axis being associated with a second colour; and
   iii) a third axis extending along an axial plane of said body, said third axis being associated with a third colour.

10. A process as claimed in claim 9, including:
    selecting one of said first, second or third axes as an axis to which said segment is substantially aligned in parallel or collinear with; and
    selecting a colour associated with the selected axis as a colour associated with said segment.

11. A process as claimed in claim 8, including using said intensity value to select a colour within a predetermined range of colours, each said colour with said predetermined range being associated with one or more different said intensity values.

12. A system including an image processing module that performs a process as defined in claim 1.

13. A computer program product, comprising a non-transitory computer readable storage medium having computer-executable program code embodied therein, said computer-executable program code adapted for controlling an image processor to perform a process as defined in claim 1.

* * * * *